United States Patent [19]

Torigoe et al.

[11] Patent Number: 4,875,076

[45] Date of Patent: Oct. 17, 1989

[54] EXPOSURE APPARATUS

[75] Inventors: Makoto Torigoe, Kawasaki; Akiyoshi Suzuki, Tokyo, both of Japan

[73] Assignee: Canon Kabushiki Kaisha, Tokyo, Japan

[21] Appl. No.: 206,490

[22] Filed: Jun. 14, 1988

[30] Foreign Application Priority Data

Jun. 15, 1987 [JP] Japan ................. 62-147005
Sep. 29, 1987 [JP] Japan ................. 62-245244
Oct. 27, 1987 [JP] Japan ................. 62-271388
Dec. 28, 1987 [JP] Japan ................. 62-329722

[51] Int. Cl.⁴ .............................. G03B 27/42
[52] U.S. Cl. ........................ 355/53; 355/30; 355/77
[58] Field of Search ............. 355/53, 41, 30, 77

[56] References Cited

U.S. PATENT DOCUMENTS 4,395,117 7/1983 Suzuki .
4,506,977 3/1985 Sato et al. ................. 355/53
4,597,664 7/1986 Johannsmeier et al. ..... 355/53
4,629,313 12/1986 Tanimoto ................. 355/53
4,645,924 2/1987 Suzuki et al. .

FOREIGN PATENT DOCUMENTS 114529 6/1986 Japan .

Primary Examiner—Monroe H. Hayes
Attorney, Agent, or Firm—Fitzpatrick, Cella, Harper & Scinto

[57] ABSTRACT

Step-and-repeat exposure apparatus for printing, by way of a projection optical system, images of a pattern formed on a reticle upon different portions of a semiconductor wafer, placed on a movable stage, is disclosed. On the portion of the movable stage other than the portion upon which the semiconductor wafer is placed, an erasably writable recording medium such as, for example, a magneto-optic recording material or a photochromic material is provided. An image of a mark of a reticle is formed on the recording medium by use of the projection optical system, the thus formed image being photoelectrically detected. From the result of the detection, alignment information concerning, for example, a magnification error, a focus error, a positional error between the reticle and the wafer, for example is obtained.

24 Claims, 17 Drawing Sheets

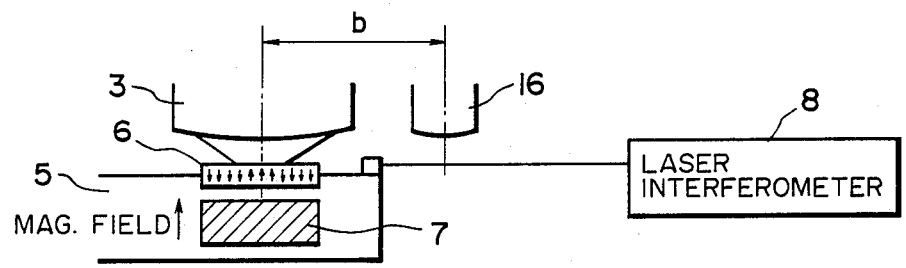
F I G. 14A
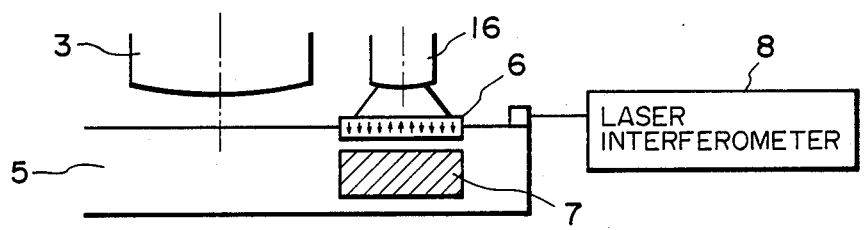
F I G. 14B
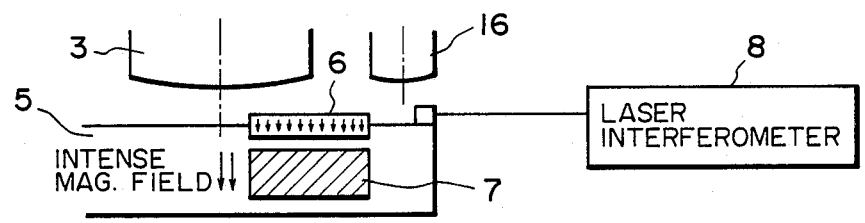
F I G. 14C

EXPOSURE APPARATUS

FIELD OF THE INVENTION AND RELATED ART

This invention relates to an exposure apparatus and, more particularly, to an exposure apparatus suitably usable in the manufacture of semiconductor microcircuit devices for printing through a projection optical system a pattern formed on a reticle (mask) upon a photoresist layer on the surface of a semiconductor wafer.

Usually, such an exposure apparatus is provided with an alignment function because of the necessity of superimposingly printing different patterns of various reticles upon the same semiconductor wafer. There are two types of alignment systems: one is a TTL (through-the-lens) alignment system wherein alignment marks of a reticle and/or a wafer are observed through a projection optical system to obtain alignment information; whereas the other is an off-axis alignment system wherein the alignment information is obtained by observing one or more alignment marks formed on a wafer by use of an observation optical system, such as a microscope, which is provided at a position spaced away from the optical axis of a projection optical system.

While the TTL alignment system has an advantage of better alignment accuracy, there is a necessity of correcting, by suitable means, optical aberrations caused by the projection optical system when the observation of alignment marks is made by use of a light of a wavelength different from that used for the pattern printing. In this case, therefore, a complicated structure is required. When the pattern printing wavelength is also used for the observation, different problems arise. One is that the photoresist material applied to the wafer is sensitized at the time of the mark observation. Another problem is that, when a resist structure such as a multi-layered resist structure having a good light absorbing property (efficiently absorbing the light of the pattern printing wavelength) is used, an insufficient quantity of light is reflected from the wafer at the time of the mark observation. In the off-axis alignment system, on the other hand, light of a wavelength different from the pattern printing wavelength may be used for the mark observation without any specific inconvenience. Also, the required structure is simple. However, problems may easily arise with respect to the alignment accuracy.

SUMMARY OF THE INVENTION

It is an object of the present invention to provide an improved exposure apparatus having an improved alignment function which allows the observation using light of a wavelength different from a pattern printing wavelength and which assures high-precision alignment with a simple structure.

Briefly, in accordance with one aspect of the present invention, to achieve this object, there is provided an exposure apparatus for printing, through a projection optical system, a pattern of a first object such as, for example, a reticle upon a radiation sensitive layer on a second object such as, for example, a photoresist layer on a semiconductor wafer placed on a movable stage, wherein a writable and erasable (i.e. erasably writable) recording medium such as, for example, a magneto-optic recording material, a photochromic material or otherwise is provided on such portion of the movable stage other than the portion on which the second object is placed.

For example, where it is desired to conduct "base line correction" for correcting data concerning the interval between optical axes of a projection optical system and an off-axis observation optical system, the aforesaid recording medium may be exposed through the projection optical system so that an image of a mark of the first object may be "printed" on the recording medium. Thereafter, the movable stage may be displaced, with the amount of displacement thereof being measured by suitable means, so that the "printed" image of the mark may be located under the observation optical system and observed thereby. With this procedure, alignment information is obtainable by observing an image being formed on a medium maintained under determined conditions. Therefore, high-precision and high-speed correction is attainable. This is quite contrasted to the case where an image of a mark is printed on a photoresist layer since, in the latter case, there is a possibility that the state of the formed image is different depending on the conditions of the resist layer provided on the second object (wafer).

In another aspect, the present invention allows high-precision correction of a magnification error and/or a focus error. It is known that such a magnification error or a focus error is not constant but is variable. As for the magnification error, it varies with the expansion/contraction of a second object (wafer) due to the processes thereof such as an etching process, a diffusion process or otherwise or, alternatively, with the change in the environment conditions of a projection optical system such as an ambient temperature, an ambient pressure or otherwise. Also, the focus error is variable with the change in the environment conditions. Particularly, with regard to the depth of focus of a projection optical system, there are the following relations:

$$W = K_1 \cdot \lambda / NA$$

$$d = K_2 \cdot \lambda / (NA)^2$$

wherein W is the linewidth of a printed pattern, $\lambda$ is the wavelength of light used for the pattern printing, NA is the numerical aperture, d is the depth of focus and $K_1$ and $K_2$ are constants. It is seen therefrom that, if a shorter wavelength $\lambda$ or a larger numerical aperture NA is used for narrowing the linewidth W, the depth of focus of a projection optical system is reduced in proportion to the shortening of the wavelength or in proportion to the square of the increment of the numerical aperture. Accordingly, the narrower the linewidth of the printed pattern is, the larger the effect of the focus shift is. Further, in an exposure apparatus of the type wherein an excimer laser whose spectral bandwidth is narrowed is used as a light source, any change in the emission wavelength of the excimer laser will cause a change in the magnification or in the focus position.

Accordingly, it is another object of the present invention to provide an exposure apparatus by which high-precision real-time correction of any magnification error and/or focus error is attainable.

These and other objects, features and advantages of the present invention will become more apparent upon consideration of the following description of the preferred embodiments of the present invention taken in conjunction with the accompanying drawings.

BRIEF DESCRIPTION OF THE DRAWINGS

FIGS. 14A–14C are schematic views, respectively, explicating the action made in the neighborhood of a magneto-optic recording medium used in the apparatus of FIG. 12.

DESCRIPTION OF THE PREFERRED EMBODIMENTS

Referring to the attached drawings, embodiments of the present invention will be described.

Figure 1:
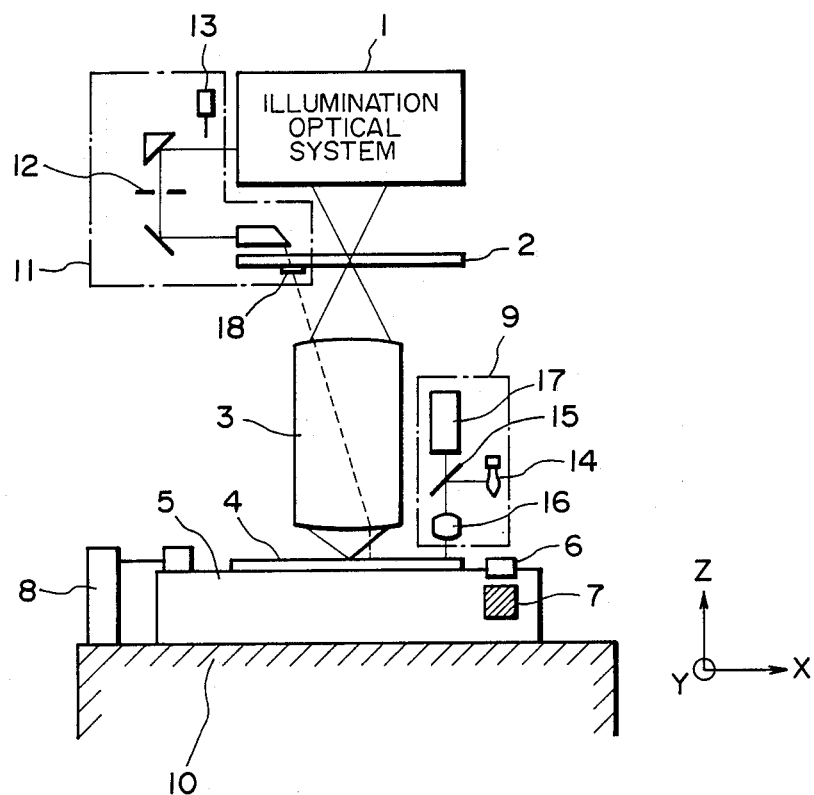
FIG. 1 is a schematic view showing a general structure of an exposure apparatus according to one embodiment of the present invention.

FIG. 1 shows a general structure of a step-and-repeat type exposure apparatus according to one embodiment of the present invention.

In FIG. 1, light emanating from an illumination optical system 1 irradiates a reticle 2 so that a pattern formed thereon is transferred through a projection optical system 3 onto one of different portions (shot areas) of a wafer 4. The wafer 4 is held on a movable stage 5 which is movably disposed on a surface plate 10 for stepwise movement for the step-and-repeat exposures of the wafer 4.

The movable stage 5 is adapted to be moved in X and Y directions by means of driving systems, not shown, and the displacement (the amount of movement) of the stage is monitored by use of X-axis and Y-axis laser interferometric gauges. In FIG. 1, only the X-axis laser interferometric gauge is illustrated at reference numeral 8 and the Y-axis laser interferometric gauge is not shown. Each laser interferometric gauge 8 emits a laser beam along an optical axis whose height (in a Z-axis direction) is the same as the height of the wafer 4 surface for preclusion of an Abbe's error.

Provided on the movable stage 5 and outside the wafer 4 is a magneto-optic recording medium 6 which is disposed so that the height of the surface thereof is coincident with the height of the wafer 4. Further, as required, there may be provided an adjusting mechanism which is effective to bring the height of the surface of the magneto-optic recording medium 6 and the height of the wafer 4 into exact coincidence with each other. Provided below the magneto-optic recording medium 6 is an electromagnet 7 which is embedded in the movable stage so as to apply a magnetic field in the direction of the optical axis of the projection optical system 3, i.e. along the Z-axis.

Alignment optical system 9 comprises, for example, a lamp 14 adapted to emit a light of a wavelength with respect to which a resist material applied to the wafer 4 is substantially insensitive; an optical-path dividing beam splitter 15; an objective lens 16; and an observation TV camera 17. The pictorial image as obtained by the TV camera 17 is transmitted to a computer, not shown, and is processed therein such that the position detection is carried out.

Another illumination optical system 11 is provided to illuminate an alignment mark 18 formed on the reticle. This optical system 11 functions to extract a portion of the photoprinting light of the illumination optical system 1 to irradiate a slit member 12 and also functions to form an image of a slit aperture of the slit member 12 upon the reticle 2 surface. The introduction of the light beam from the illumination optical system 1 to the mark illuminating optical system 11 is "ON/OFF" controlled by means of a shutter 13.

Figure 2A:
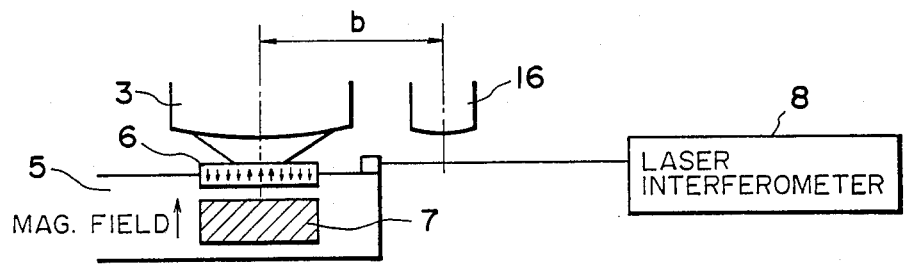
FIGS. 2A–2C are schematic views, respectively, explicating the action made in the neighborhood of a magneto-optic recording medium used in the apparatus of FIG. 1.
Figure 2B:
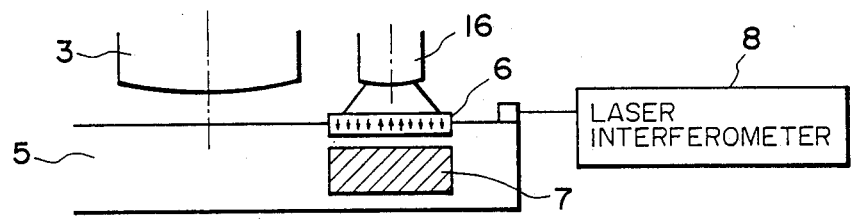
Figure 2C:
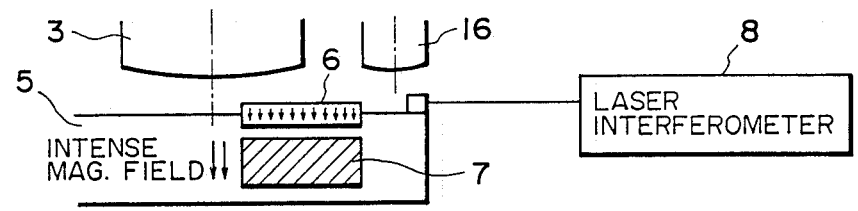
Figure 3:
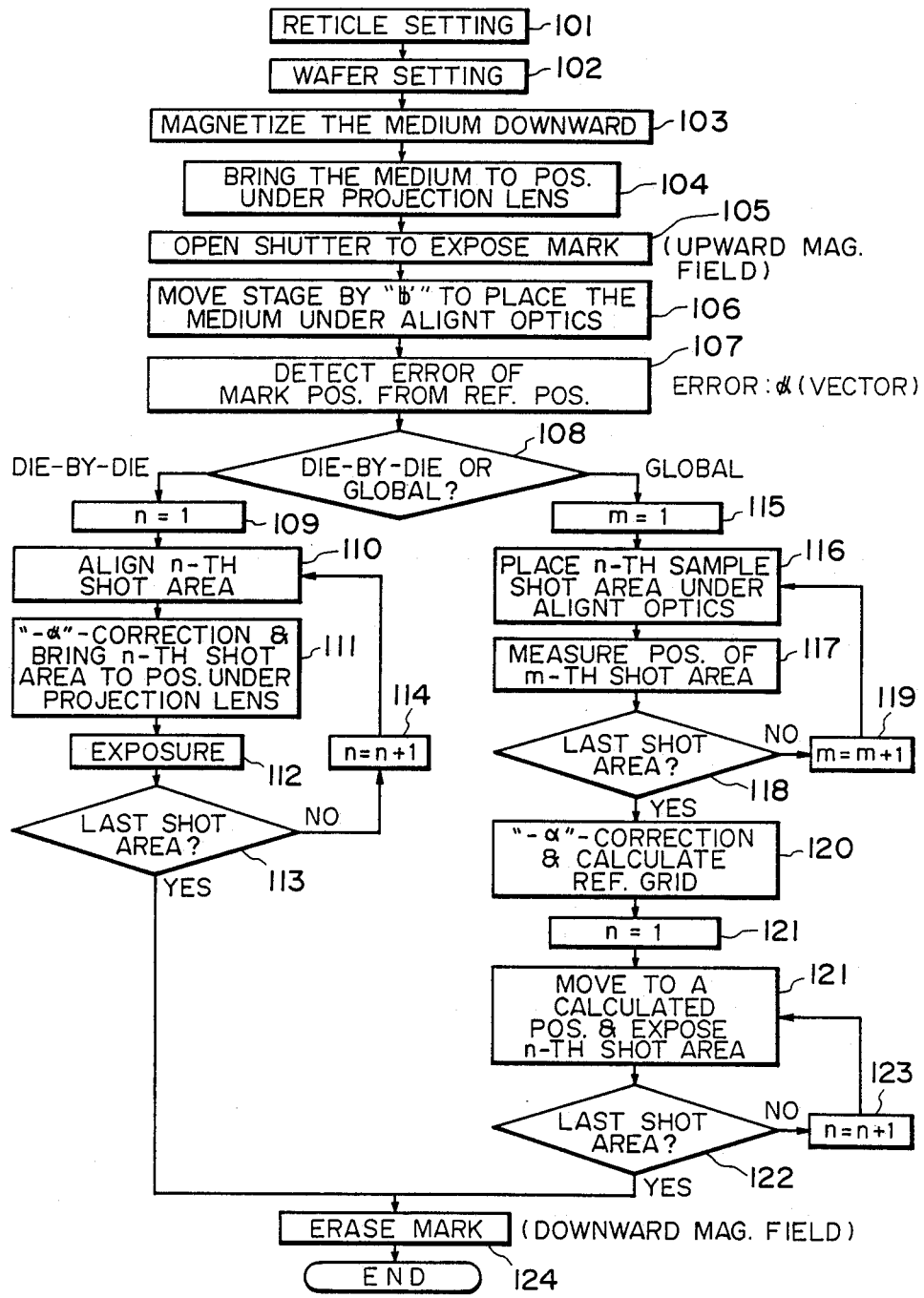
FIG. 3 is a flow chart showing the manner of the alignment operation made in the apparatus of FIG. 1.

Taking in conjunction with FIGS. 2A–2C schematically illustrating the action made in the neighborhood of the magneto-optic recording medium 6, description will now be made in accordance with the flow chart of FIG. 3 to the manner of monitoring the distance between the optical axes of the projection optical system 3 and the alignment optical system 9 included in the apparatus of FIG. 1.

The situation is that, such as illustrated in FIG. 1, a reticle 2 has been set at a predetermined position (Step 101) and a wafer 4 has been placed on the movable stage 5 (Step 102). The following operations are made under the situation described.

(a) FIG. 2A

First, at Step 103, the medium 6 is preparatorily magnetized downward. At Step 104, the movable stage 5 is displaced so as to locate the medium 6 at a position which is just underneath the projection optical system 3 and on which the alignment mark 18 of the reticle 2 is going to be imaged. Subsequently, at Step 105, the shutter 13 opens so that the alignment mark 18 on the reticle is exposed to the light from the mark irradiating optical system 11. As a result, an image of the mark 18 is formed on the medium 6. On such an occasion, the electromagnet 7 may be preparatorily actuated to apply an upward magnetic field. Thus, only such portion of the medium 6 on which the light impinges can absorb the light and the temperature of that portion increases to the Curie point due to the heat caused thereby, with the result that the direction of magnetization is reversed.

In this manner, there is formed in the medium 6 a reversely magnetized portion of a shape corresponding to that of the alignment mark 18. The resolution of the medium 6 is determined by the magnitude of the domain and is about 0.02 micron in this example which is sufficient for the purpose of the present embodiment. Further, use of an ultraviolet light which is usually used for the semiconductor exposure purpose is effective because usually a magneto-optic medium 6 shows a high absorption factor and the photon energy itself is high.

After the exposure of the mark 18 is completed, the shutter 13 is closed.

(b) FIG. 2B

Subsequently, at Step 106, the movable stage is displaced through a vector "$b$" which is substantially the same as the vector extending from the position of the mark 18 exposure by the projection optical system 3 to the optical axis of the alignment optical system 9, so as to locate the medium 6 at a position substantially right under the objective lens 16 of the alignment optical system 9. The displacement "$b$" in the X and Y directions during such movement is precisely measured by the laser interferometric gauges 8. At that position, the alignment mark now formed on the medium 6 (as a result of Step 105 described hereinbefore) is observed and, on the basis of the difference in the state of polarization resulting from the difference in the direction of magnetization, any error or deviation "$a$" of the position of the mark on the medium 6 with respect to a certain reference position (which may be determined by a reference mark formed in the alignment optical system 9) is detected. From the displacement of the stage 5 having been measured by the laser interferometric gauges 8 and the detected error "$a$" of the mark position as well as by using the data concerning the distance between the mark 18 and the optical axis of the projection optical system 3, it is possible to accurately detect the distance between the optical axes of the projection optical system 3 and the alignment optical system 9.

For the subsequent step-and-repeat exposures which start with Step 108, the movable stage is moved so as to locate an alignment mark of a predetermined shot area on the wafer 4 under the alignment optical system 9. Thereafter, by use of this optical system 9, any positional error $c$ of that alignment mark of the wafer 4 with respect to the reference position defined in the optical system 9 is measured. Thereafter, by an amount corresponding to the sum of the error $c$ and the distance between the optical axes detected in the previous Step, the movable stage 5 is displaced in accordance with the output of the laser interferometric gauge 8, whereby the aforesaid predetermined shot area is aligned with respect to the exposure position. Alternatively, the data concerning the positional error $c$ is corrected by use of the previously detected error "$a$" so as to exclude, out of the error $c$, the component which results from the error in the distance between the optical axes of the optical systems 3 and 9. By doing so, correct data for the subsequent alignment operation can be obtained.

In this example a desired one of a die-by-die alignment procedure (Steps 109–114) and a global alignment procedure (Steps 115–123) can be selected at Step 108 and the exposures can be made accordingly. In the case of the die-by-die alignment procedure, the positional error of each shot area on the wafer 4 is measured such that every shot area on the wafer is aligned on the basis of the positional error data peculiar thereto. In the case of the global alignment procedure, on the other hand, some shot areas (sample shot areas) on the wafer are elected and, from the measured values concerning the positions of alignment marks of these shot areas and from the coordinate positions of the stage 5 at the time of the measurements of the mark positions, a reference grid representing the array of the shot areas on the wafer 4 is prepared by calculation, the thus prepared reference grid being used subsequently to control the step-and-repeat movement of the stage 5 to thereby control the alignment of all the shot areas of the wafer.

(c) FIG. 2C

When, as the movable stage 5 is at an arbitrary position, the electromagnet 7 is actuated to apply an intense downward magnetic field, the whole of the medium 6 is magnetized downwardly so that the mark is erased. Thus, the medium 6 is prepared for reuse. This is made at Step 124 after the completion of the step-and-repeat exposures.

The present invention is not limited to the form of the above-described embodiment, but may be modified conveniently.

For example:

(I) The erasing of the mark at Step 124 may be conducted just before the mark exposure at Step 105. Further, at the time of erasing, the whole surface of the medium 6 may be irradiated with light. By doing so, the mark can be, erased only with a magnetic field of an intensity similar to that of the magnetic field applied at the time of the mark exposure, without use of an intense magnetic field.

(II) The electromagnet 7 may be replaced by a permanent magnet which can be inverted upside-down. Also, with regard to the position thereof, it may be disposed at any of various positions other than the position right under the medium 6. In short, the magnetic field applying means may be of any structure and may be disposed at any position, provided that it can apply, to the medium 6 and after the exposure, a desired upward or downward magnetic field along the optical axis of the projection optical system 3.

(III) Depending on the material used for the magneto-optic recording medium 6, there is a limitation to the number of serviceable cycles. Also, there is a possibility of changes with aging. In consideration of them, the portion including the medium 6 may be preferably formed into a unit part, which can facilitate the replacement, for example.

Figure 4:
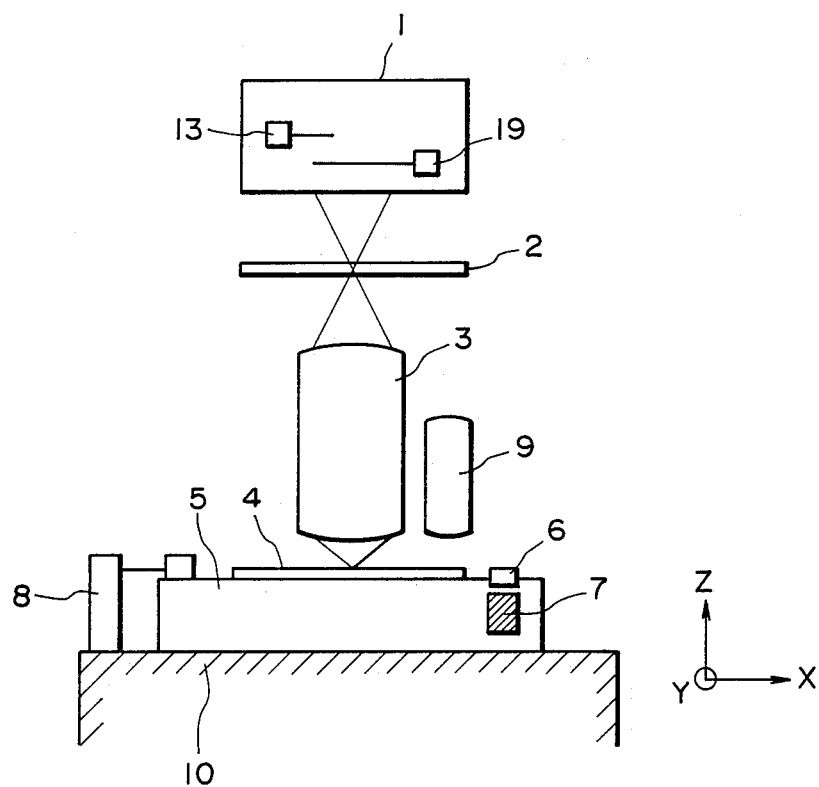
FIG. 4 is a schematic view of an exposure apparatus according to another embodiment of the present invention.
Figure 5:
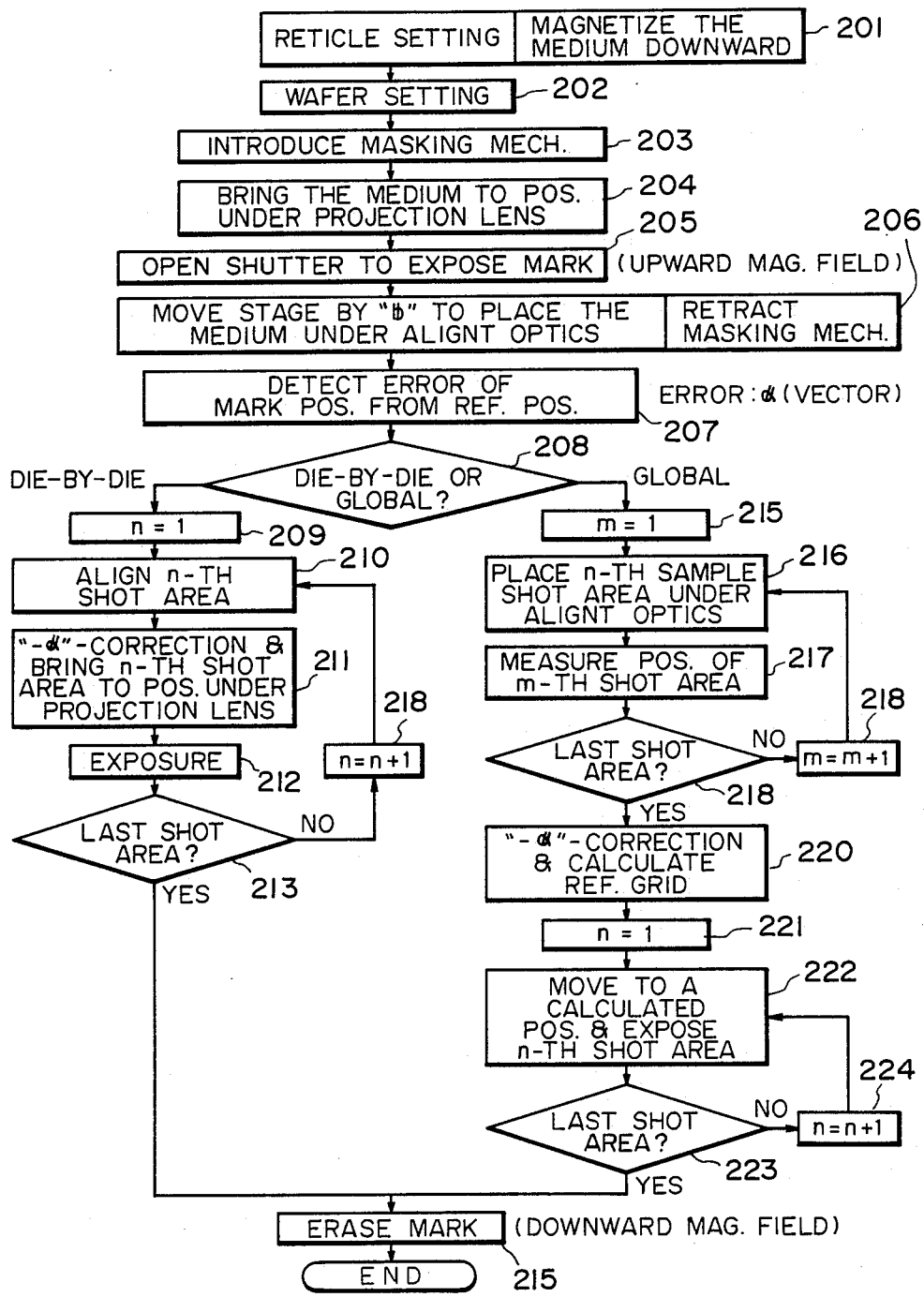
FIG. 5 is a flow chart showing the manner of operation made in the apparatus of FIG. 4.

(IV) The irradiation of an alignment mark on a reticle may be made without use of the mark irradiating optical system 11. For example, as shown in FIG. 4, the alignment mark can be irradiated by directly using the illumination optical system 1. In such a case, the whole surface of a reticle 2 may be illuminated. However, depending on the environmental conditions, it is possible that a formed magneto-optic image changes due to the heat, resulting in deterioration of the precision. In order to prevent this, a masking mechanism such as at 19 may be provided within the illumination optical system 1 so as to assure that, with this masking mechanism 19, only an alignment mark of the reticle 2 is illuminated at the time of the printing of the mark on the medium 6 for the formation of a magneto-optic image of the mark. An example of the operational sequence in such a case is illustrated in the flow chart of FIG. 5. In this example, the masking and the removal thereof are carried out at Step 203 and 206 before and after the mark exposure at Step 205.

(V) As described hereinbefore, the detection of the image of the alignment mark 18, formed on the medium 6, is based on the detection of the difference in the state of polarization. Accordingly, it is very effective to construct the alignment optical system 9 so that it can be used as a polarization microscope.

(VI) The mark irradiating optical system 11 may be used for the positioning of a reticle.

(VII) On an occasion where the light source in the illumination optical system 1, used for the pattern printing, comprises an "ON/OFF" controllable light source means such as a laser, the shutter 13 may be omitted.

(VIII) As for the light source for irradiating the mark 18, it is not always necessary to extract a portion of the photoprinting light from the illumination optical system 1. A separate light source which produces a light of substantially the same wavelength may be used.

Next, another embodiment of the present invention will be described with reference to FIG. 6. In the embodiment which will be described just below, a photochromic material is used as the recording medium.

Figure 6:
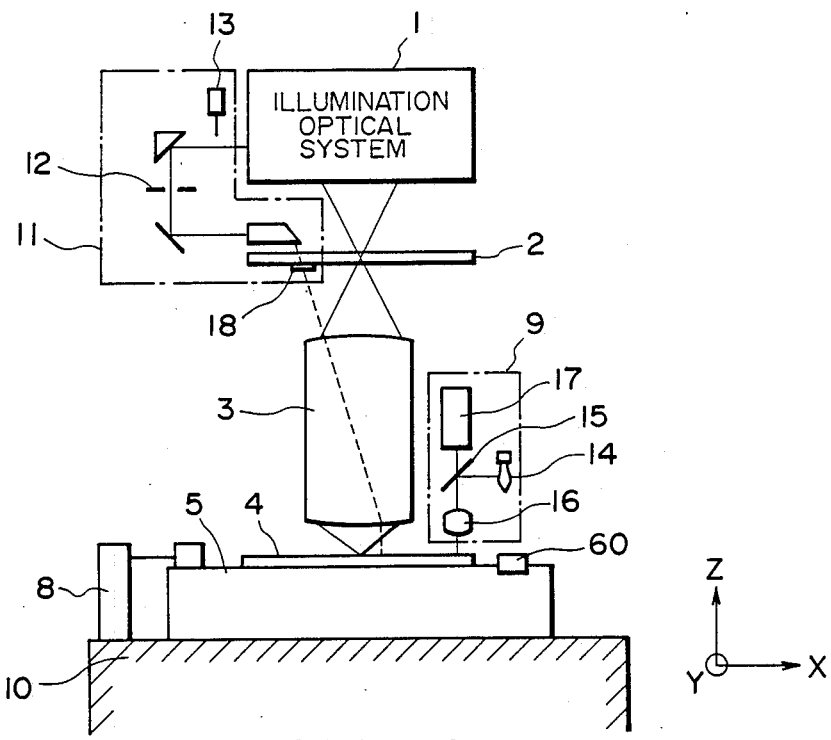
FIG. 6 is a schematic view showing a general structure of an exposure apparatus according to a further embodiment of the present invention.

In FIG. 6, light emanating from an illumination optical system 1 irradiates a reticle 2 so that a pattern formed thereon is transferred through a projection optical system 3 onto one of different portions (shot areas) of a wafer 4. The wafer 4 is held on a movable stage 5 which is movably disposed on a surface plate 10 for stepwise movement for the step- and-repeat exposures of the wafer 4.

The movable stage 5 is adapted to be moved in X and Y directions by means of driving systems, not shown, and the displacement (the amount of movement) of the stage is monitored by use of X-axis and Y-axis laser interferometric gauges. In FIG. 6, only the X-axis laser interferometric gauge is illustrated at reference numeral 8 and the Y-axis laser interferometric gauge is not shown. Each laser interferometric gauge 8 has an optical axis whose height (in a Z-axis direction) is the same as the height of the wafer 4 surface for preclusion of an Abbe's error.

Provided on the movable stage 5 and outside the wafer 4 is photochromic glass plate 60 which is disposed so that the height of the surface thereof is coincident with the height of the wafer 4. Further, as required, there may be provided an adjusting mechanism which is effective to bring the height of the surface of the photochromic glass plate 60 and the height of the wafer 4 into exact coincidence with each other.

Alignment optical system 9 comprises, for example, a lamp 14 adapted to emit a light of a wavelength with respect to which a resist material applied to the wafer 4 is substantially insensitive; an optical-path dividing beam splitter 15; an objective lens 16; and an observation TV camera 17. The pictorial image as obtained by the TV camera 17 is transmitted to a computer, not shown, and is processed therein such that the position detection is carried out.

Another illumination optical system 11 is provided to illuminate an alignment mark 18 formed on the reticle. This optical system 11 functions to extract a portion of the photoprinting light of the illumination optical system 1 to irradiate a slit member 12 and also functions to form an image of a slit aperture of the slit member 12 upon the reticle 2 surface. The introduction of the light beam from the illumination optical system 1 to the mark illuminating optical system 11 is "ON/OFF" controlled by means of a shutter 13.

Figure 7A:
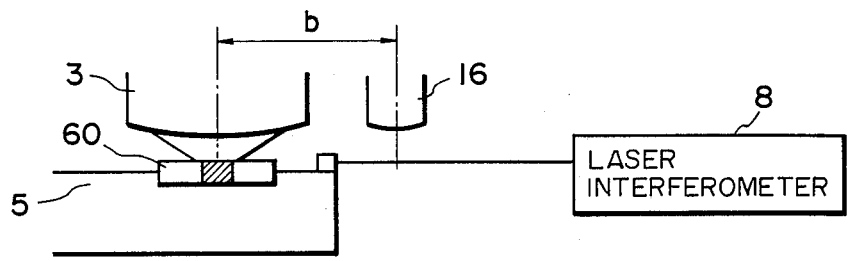
FIGS. 7A and 7B are schematic views, respectively, showing the action made in the neighborhood of a photochromic glass plate used in the apparatus of FIG. 6.
Figure 7B:
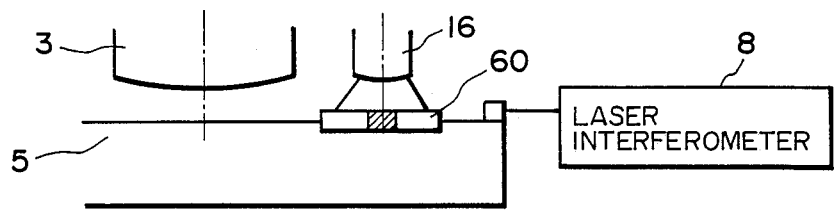
Figure 8:
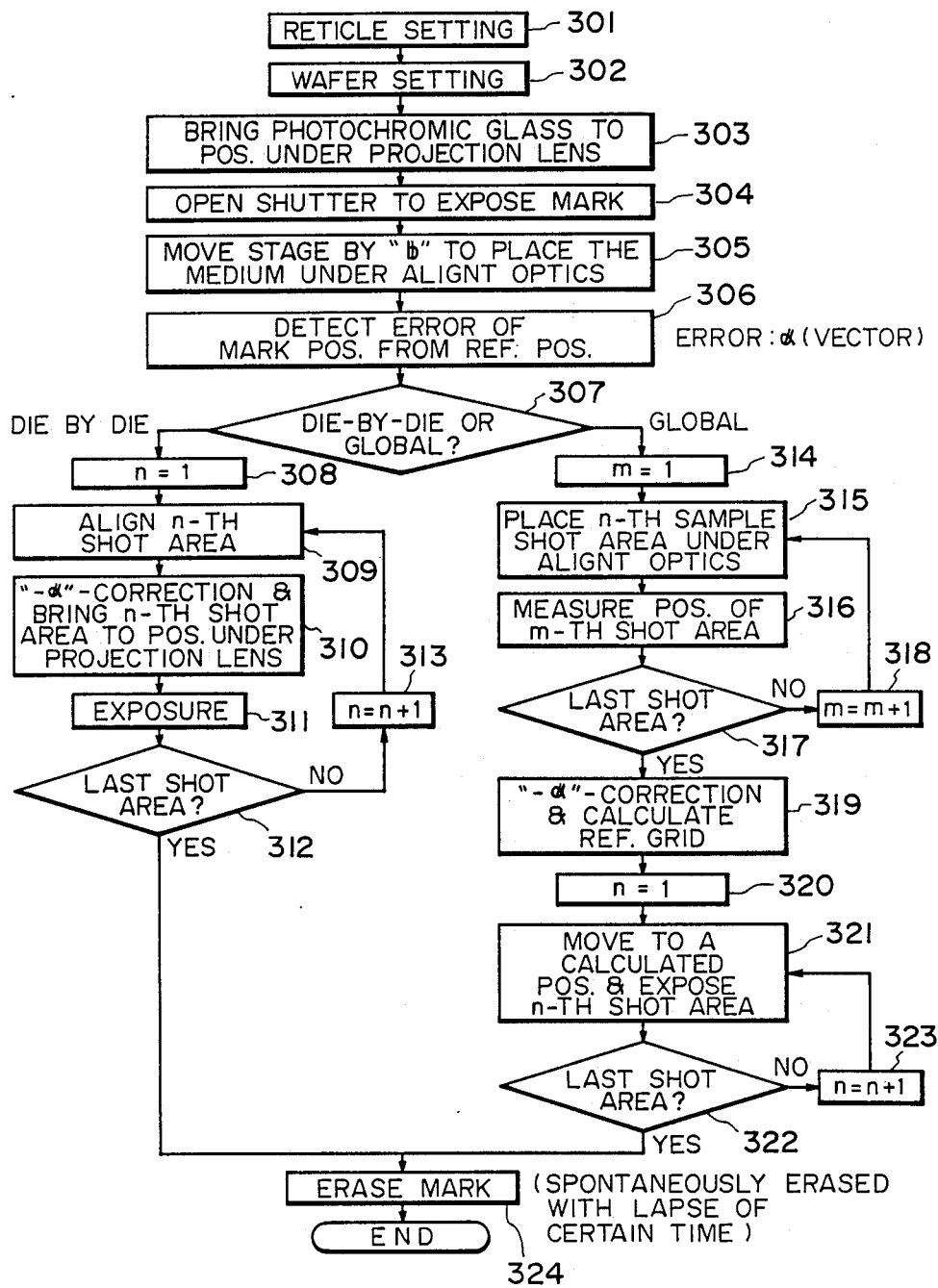
FIG. 8 is a flow chart showing the manner of the alignment operation made in the apparatus of FIG. 6.

Taking in conjunction with FIGS. 7A and 7B schematically illustrating the action made in the neighborhood of the photochromic glass plate 60, description will now be made in accordance with the flow chart of FIG. 8 to the manner of monitoring the distance between the optical axes of the projection optical system 3 and the alignment optical system 9 included in the apparatus of FIG. 6.

(a) FIG. 7A

First, at Step 303, the movable stage 5 is displaced so as to locate the photochromic glass plate 60 at a position which is just underneath the projection optical system 3 and on which the alignment mark 18 of the reticle 2 is going to be imaged. The reticle 2 has been held immovable at a predetermined position, relative to the projection optical system 3. Subsequently, at Step 304, the shutter 13 opens so that the alignment mark 18 on the reticle is exposed to the light from the mark irradiating optical system 11. As a result, the mark 18 is imaged on the photochromic glass plate 60. At this time, since the photochromic glass plate 60 has such characteristics that only such a portion as being irradiated with light (particularly, ultraviolet light) is colored due to the photochemical action, an image of the mark 18 is formed on this glass plate 60. Usually, the ultraviolet light usable for the semiconductor exposure Purpose has a large photon energy as compared with that of an ordinary visible light, a sharp image of the mark can be formed with certainty. After the exposure of the mark 18 is completed, the shutter 13 is closed.

(b) FIG. 7B

Subsequently, at Step 305, the movable stage is displaced through a vector "$\boldsymbol{b}$" which is substantially the same as the vector extending from the position of the mark 18 exposure by the projection optical system 3 to the optical axis of the alignment optical system 9, so as to locate the photochromic glass plate 60 at a position substantially right under the abjective lens 16 of the alignment optical system 9. The displacement "$\boldsymbol{b}$" in the X and Y directions during such movement is precisely measured by the laser interferometric gauges 8. At that position, the alignment mark now formed on the glass plate 60 (as a result of Step 304 described hereinbefore) is observed by use of the TV camera 17.

At this time, it is desirable to use, as the observation light, a faint light or such a light of a long wavelength having a small photon energy in order to prevent that the photochromic glass plate 60 is colored by the observation light.

From the displacement of the stage 5 having been measured by the laser interferometric gauges 8 and the detected error "$\boldsymbol{b}$" of the mark position, it is possible to accurately detect the distance between the optical axes of the projection optical system 3 and the alignment optical system 9.

Thereafter, as in the embodiment described before, a desired one of a die-by-die alignment procedure (Steps 308–313) and a global alignment procedure (Steps 314–323) can be selected at Step 307, and the exposures can be made accordingly.

It should be noted here that the mark image formed on the photochromic glass plate 60 is spontaneously erased with the lapse of a certain time after completion of the light irradiation, so that the photochromic glass plate can be used again.

The above-described embodiment can be modified conveniently, such as follows:

(i) There is a possibility that the photochromic glass plate 60 is colored by the irradiation with light, other than the photoprinting light, such as an external illumination light, for example. In consideration thereof, it is desirable to protect the photochromic glass plate 60 to prevent, as much as possible, the photochromic glass plate 60 from being irradiated with unwanted light, by use of a suitable means such as a filter having specific characteristics that only the wavelength or wavelengths of the photoprinting light and the alignment observation light are transmitted, whereas light of other wavelengths is intercepted.

(ii) Usually, a photochromic glass plate has such characteristics that the speed of coloring and decoloring becomes higher with a lower temperature. For this reason, it is desirable to provide the stage 5 with a cooling mechanism such as at 70 in FIG. 9, for cooling photochromic glass plate 60. With this mechanism, the photochromic glass plate may be cooled during the above-described mark exposure so as to increase the mark printing speed. Also, the photochromic glass plate may be cooled after completion of the measurement of the mark position so as to increase the mark erasing speed. By doing so, a further reduction of the alignment time is attainable, with the result that the throughput can be increased accordingly. Further, a heating mechanism for heating a photochromic glass plate 60 may be provided, so as to heat the glass plate during the mark observation. By doing so, it is possible to prevent the coloring of the photochromic glass plate 60 by the irradiation with the mark observation light. This can be attained by, for example, annexing a heating function to the above-described cooling mechanism 70 so that the same can operate as a heating/cooling mechanism.

(iii) Depending on the material of the photochromic glass used or the time interval between successive cycles of the sequential operation according to the present invention, there is a possibility that the mark formed on the photochromic glass plate is not completely erased before the subsequent mark exposure. On such an occasion, each time the image of the mark may be formed at a slightly shifted position upon the same photochromic glass plate. Assuming that a photochromic glass plate used has a size of 1-centimeter square while the mark observation field of the alignment optical system 9 has a size of 100-micron square, there are ten thousand mark printing positions, which is sufficient for this purpose.

Figure 9:
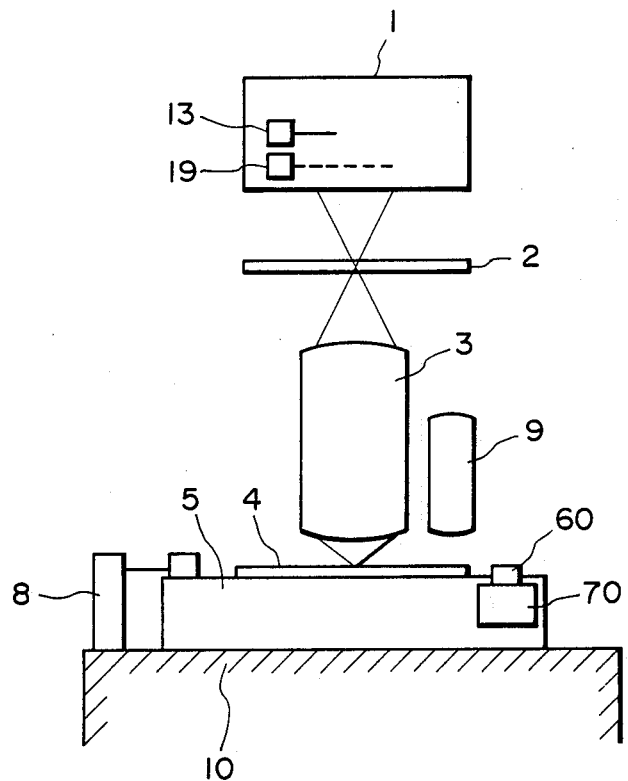
FIG. 9 is a schematic view of an exposure apparatus according to yet another embodiment of the present invention.
Figure 10:
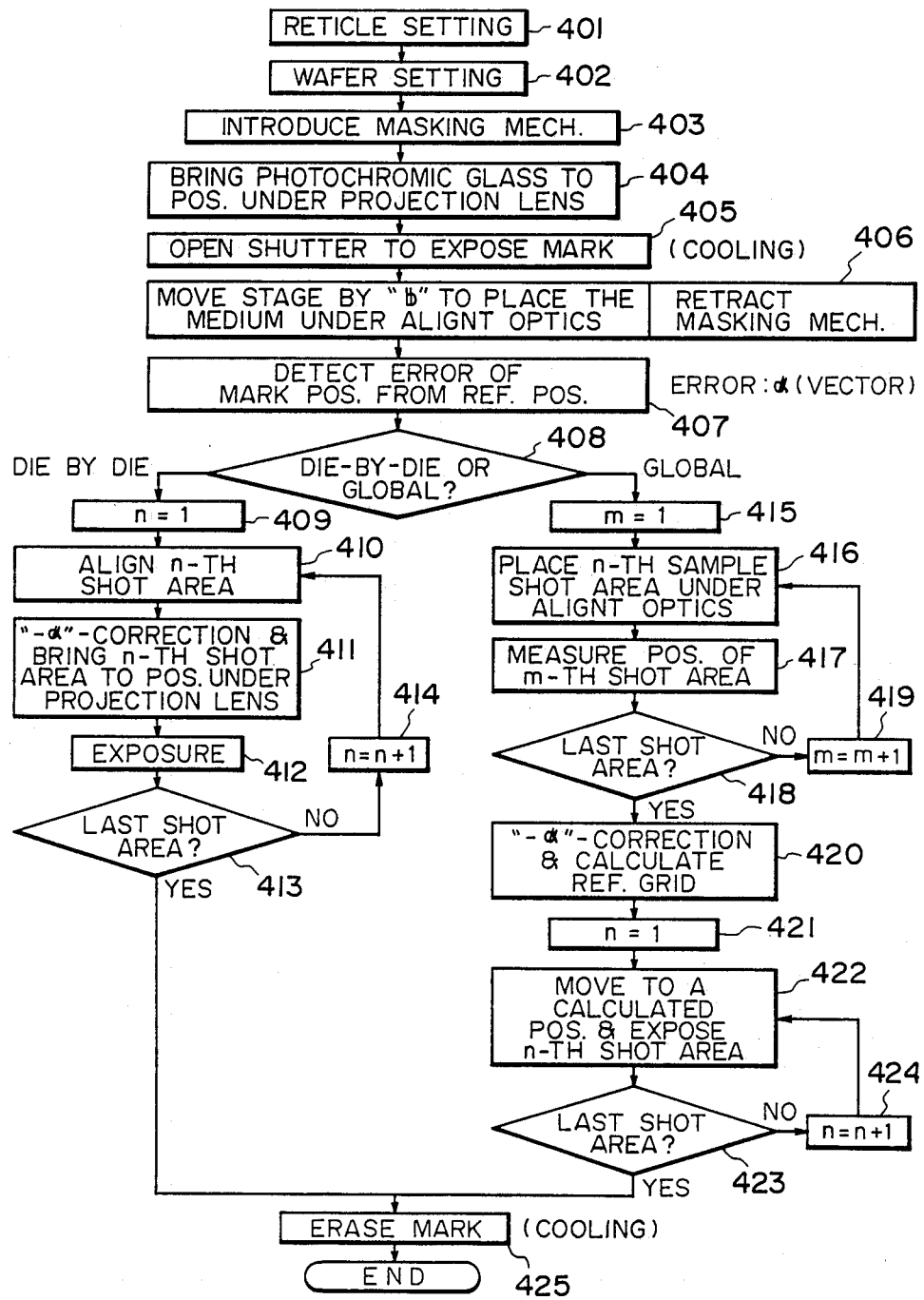
FIG. 10 is a flow chart showing the manner of operation made in the apparatus of FIG. 9.

(iv) The irradiation of an alignment mark on a reticle may be made without use of the mark irradiating optical system 11. For example, the illumination optical system 1 may be directly used for this purpose, such as shown in FIG. 9. On such an occasion, the whole surface of a reticle may be illuminated. However, as in the case described in paragraph (iii) or otherwise, it may be desired to selectively irradiate, with light, only such a portion of the reticle 2 close to the alignment mark thereof. If this is desired, a masking mechanism 19 may be provided within the illumination optical system 1, such that only a portion of the reticle 2 is selectively exposed to form an image of the mark. FIG. 10 shows an example of the sequential monitoring operation when a masking mechanism such as described above as well as a cooling/heating mechanism such as described in paragraph (ii) are provided, namely in the case of the FIG. 9 structure. In the illustrated example, the cooling is conducted at the time of the mark exposure (Step 405) and the mark erasing (Step 425), while the heating is effected at the time of measurement (Step 407). The remaining portion is essentially the same as that of the foregoing embodiment.

Figure 11:
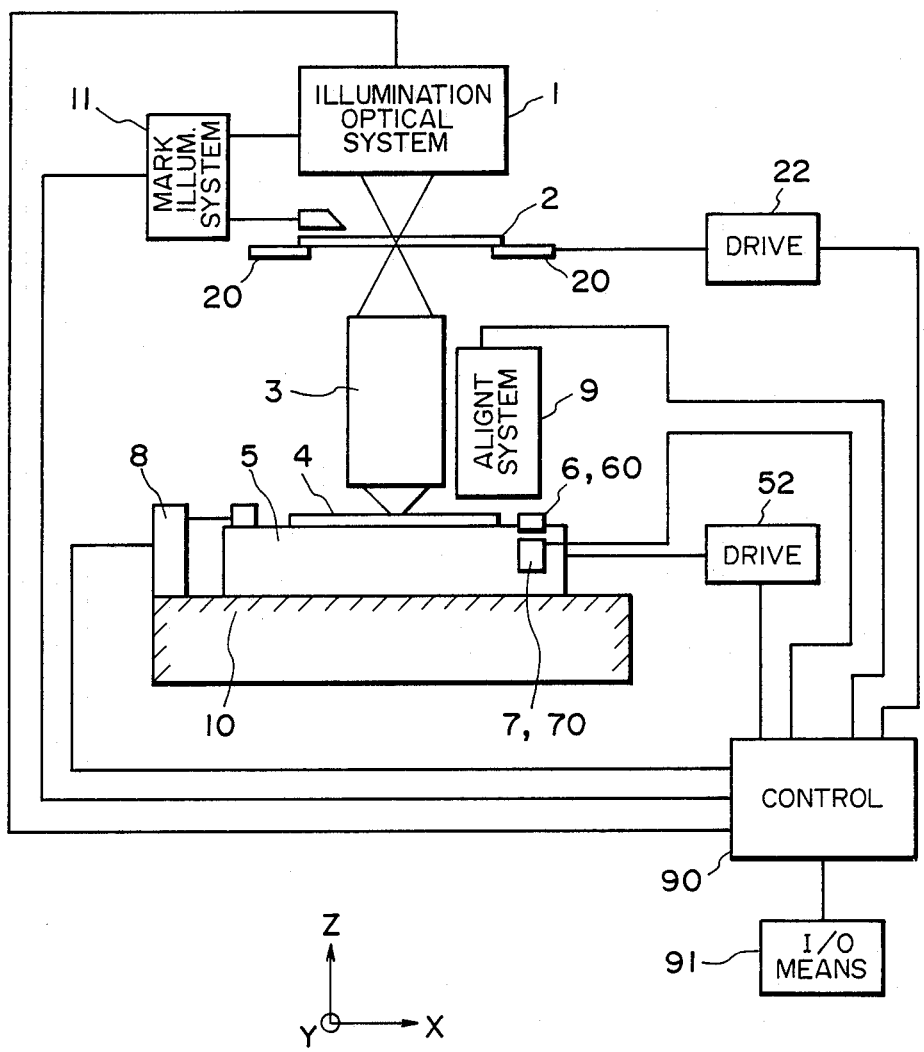
FIG. 11 is a schematic and diagrammatic view, exemplifying a systematic structure of an exposure apparatus according to the present invention.

FIG. 11 is a block diagram showing a general structure of an exposure apparatus which is capable of executing each of the sequences of the flow charts having been described with reference to the foregoing embodiments.

In FIG. 11, same reference numerals as of the foregoing embodiments are assigned to corresponding elements, so that description of these elements is omitted here for simplicity.

Denoted at 20 is a reticle stage for supporting a reticle 2. The reticle stage is movable in each of X, Y and Z directions and in a $\theta$ (rotational) direction about the Z-axis. Denoted at 22 is a reticle stage driving means for driving the reticle stage 20 in each of the X, Y, Z and $\theta$ directions. Denoted at 52 is a driving means for driving a wafer stage 5 in each of the X, Y, Z and $\theta$ directions.

Control means 90 is operable to control the alignment operation and the exposure operation, for example, to be made in the exposure apparatus of the present embodiment. Input/output means 91 is operable to apply to the control means 90 various instructions concerning the alignment or exposure conditions. Also, the input/output means operates so that specific information such as positional error information, for example, is displayed in a CRT or outputted by a printer or otherwise.

By means of signal lines as illustrated, an illumination optical system 1, a mark irradiating optical system 11, laser interferometric gauges 8, the reticle stage driving means 22, the wafer stage driving means 52, an alignment optical system 9 and an electromagnet 7 (or a heating/cooling mechanism 70) are coupled to the control means 90. Accordingly, by way of these signal lines, predetermined control signals from the control means 90 can be transmitted to the aforesaid mechanism, optical systems and driving means.

The manner of measuring the distance (reference length) between the optical axes of a projection optical system 3 and the alignment optical system 9, is substantially the same as that described hereinbefore.

The correct reference length as obtained by the measurement made in the described manner is stored into a memory (not shown) of the controller 90, and the stored data is used later as a reference value for the movement of a wafer stage 5, at the time of the positioning of a wafer (or each shot area on the wafer) to be made succeedingly.

Figure 12:
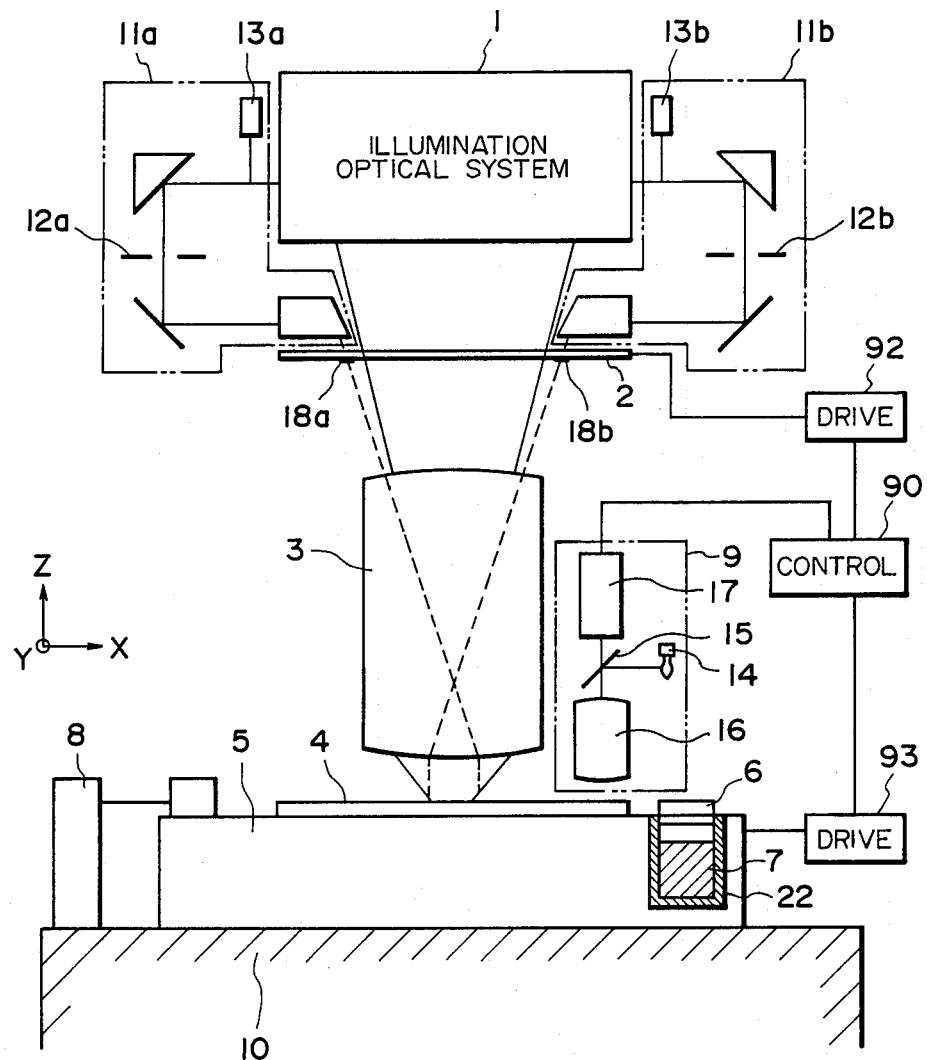
FIG. 12 is a schematic and diagrammatic view, showing a systematic structure of an exposure apparatus according to a further embodiment of the present invention.

FIG. 12 is a schematic view showing a general structure of a step-and-repeat type exposure apparatus according to a further embodiment of the present invention. In FIG. 12, light emanating from an illumination optical system 1 irradiates a reticle 2 which is a first object, so that a pattern formed thereon is transferred through a reduction projection optical system 3 onto a wafer 4 which is a second object. The wafer 4 is held on a movable stage 5 which is disposed on a surface plate 10.

The projection optical system 3 is supported by a barrel (not shown) and is provided with a lens driving means (also not shown) so that, as will be described later, predetermined one or ones of plural lens elements, constituting the projection optical system 3, can be displaced as desired.

The reticle 2 is held on a reticle stage (not shown) which is adapted to be moved by a reticle driving means 92 in each of the X, Y, Z and θ directions.

The movable stage 5 is adapted to be moved in the X and Y directions by means of a driving system 93, and the displacement (the amount of movement) of the stage is monitored by means of X-axis and Y-axis laser interferometric gauges such as at 8. Also, the movable stage 5 is movable in the direction of the Z-axis, and the position of the movable stage 5 in the Z-axis direction is monitored by a Z-axis position detecting means (not shown).

In FIG. 12, only the X-axis laser interferometric gauge is illustrated at reference numeral 8 and the Y-axis laser interferometric gauge is not shown. Each laser interferometric gauge 8 has an optical axis which is maintained at the same height as the height of the wafer 4 surface, for preclusion of an Abbe's error.

Provided on the movable stage 5 and outside the wafer 4 is a magneto-optic recording medium 6 which is disposed so that the height of the surface thereof is substantially coincident with the height of the wafer 4. Further, as required, there may be provided an adjusting mechanism which is effective to bring the height of the surface of the magneto-optic recording medium 6 and the height of the wafer 4 into exact coincidence with each other. Provided below the magneto-optic recording medium 6 is an electromagnet 7 (magnetic field applying means) which is embedded in the movable stage so as to apply a magnetic field in the direction of the optical axis of the projection optical system 3, i.e. along the Z-axis.

Additionally, in order to prevent the magnetic field, produced by the electromagnet 7, from adversely affecting other components, a magnetic shield member 22 is provided to surround the electromagnet. This shield member 22 is also effective to preclude a magnetic field from being the applied from other components to the magneto-optic recording medium 6.

Observation optical system 9 is provided at a position spaced from the optical axis of the projection optical system 3 and is disposed in parallel to the optical axis of the projection optical system. The observation optical system 9 comprises, for example, a lamp 14, an optical-path dividing beam splitter 15, an objective lens 16 and an observation TV camera 17. Additionally, the observation optical system may include a polarization microscope. The pictorial image as obtained by the TV camera 17 is transmitted to a computer 90 and is processed therein, such that the position detection and the contrast detection are carried out.

There are provided mark irradiating optical systems 11a and 11b for irradiating focus/magnification detecting marks 18a and 18b, respectively, which are formed on the reticle 2. Each of the mark irradiating optical systems 11a and 11b functions to extract a portion of the photoprinting light of the illumination optical system 1 to irradiate a corresponding one of slit members 12a and 12b, and also functions to form an image of a slit aperture of the corresponding slit member 12a or 12b upon the reticle 2 surface. The introduction of the light from the illumination optical system 1 to each of the mark irradiating optical systems 11a and 11b is "ON/OFF" controlled by means of corresponding one of shutters 13a and 13b.

Figure 13:
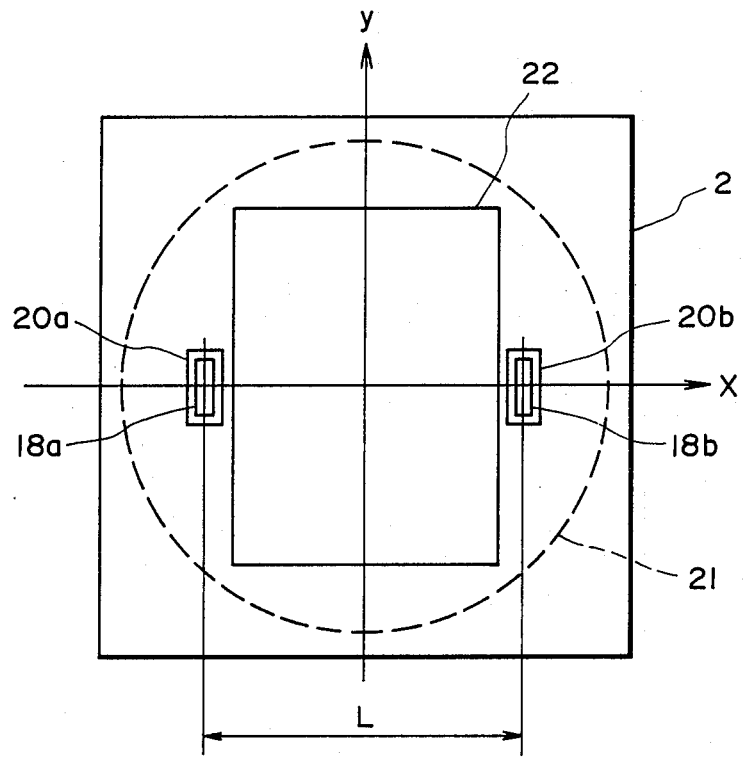
FIG. 13 is an enlarged view showing details of a reticle used it the apparatus of FIG. 2.

As best seen in FIG. 13, the two marks 18a and 18b are formed on the reticle 2 surface and at those positions outside a region 22, in which a circuit pattern is provided, and inside an effective projection field 21 as determined by the projection optical system 3. These two marks are spaced by a distance L. Denoted at 20a and 20b in FIG. 13 are the ranges of irradiation by the mark irradiating optical systems 11a and 11b, respectively.

Figure 15:
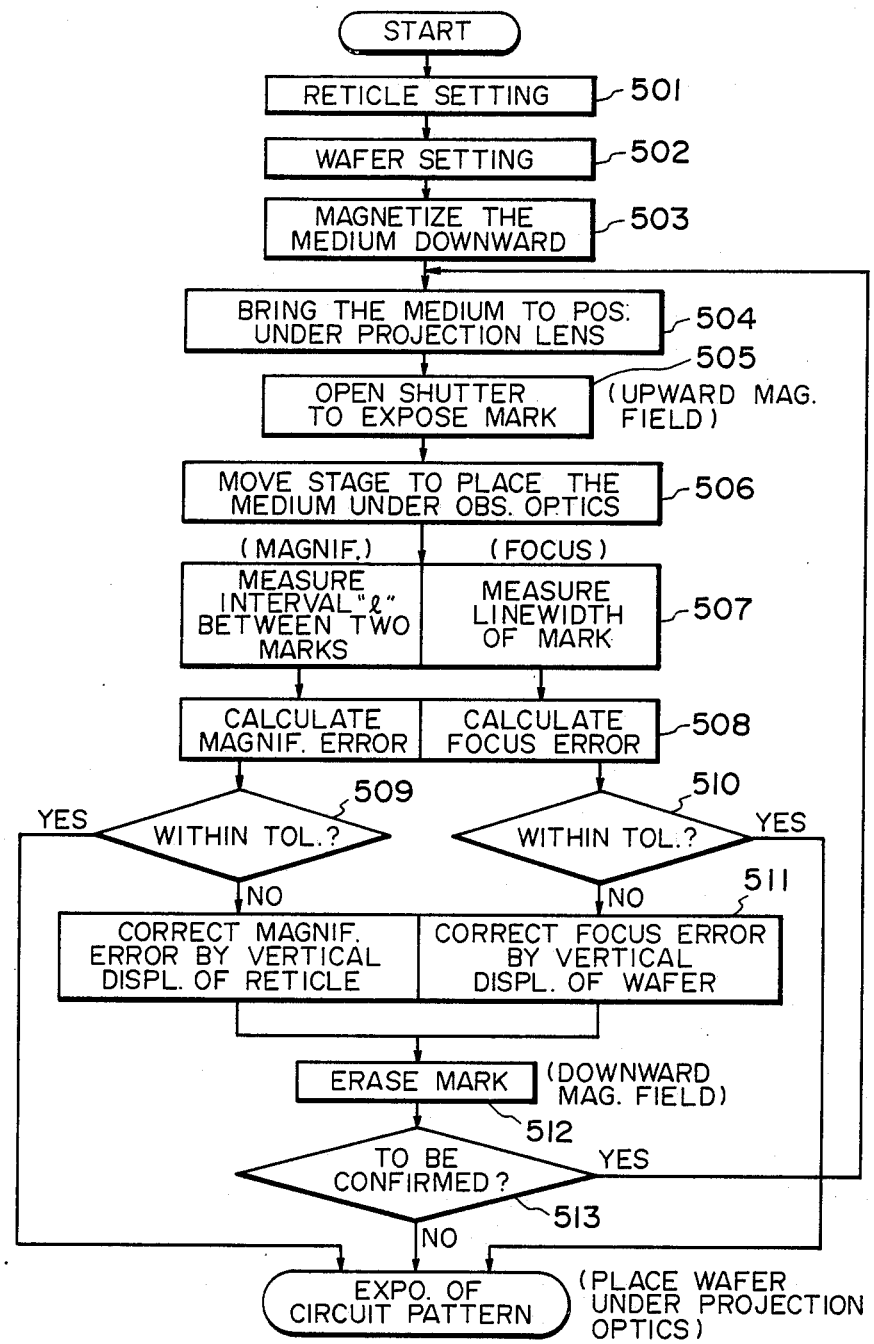
FIG. 15 is a flow chart showing the manner of the magnification and/or focus detecting operation made in the apparatus of FIG. 12.

FIGS. 14A–14C schematically illustrate the action made in the neighborhood of the magnetooptic recording medium 6 of the FIG. 12 embodiment. The manner of detection of the magnification and focus of the projection optical system 3, in the apparatus of the FIG. 12 embodiment, will now be described in conjunction with FIGS. 14A–14C as well as the flow chart of FIG. 15. In FIGS. 14A–14C, the illustration of the magnetic: shield member 22 is omitted for simplicity.

(a) FIG. 14A

First, at Step 503, the medium 6 is preparatorily magnetized downward. At Step 504, the movable stage 5 is displaced so as to locate the medium 6 at a position which is just underneath the projection optical system 3 and on which the alignment marks 18a and 18b of the reticle 2 are going to be imaged. Subsequently, at Step 505, the shutter 13a (13b) opens so that the alignment mark 18a (18b) on the reticle is exposed to the light from the mark irradiating optical system 11a (11b). As a result, an image of the mark 18a (18b) is formed on the medium 16. On such occasion, the electromagnet 7 may be preparatorily actuated to apply an upward magnetic field. Thus, only such portion of the medium 6 on which the light impinges can absorb the light and the temperature of that portion increases to the Curie point due to the heat caused thereby, with the result that the direction of magnetization is reversed.

In this manner, there are formed in the medium 6 two reversely magnetized portions (left-hand and right-hand portions) each having a shape corresponding to that of the alignment mark 18a or 18b. The resolution of the medium 6 is determined by the magnitude of the domain and is about 0.02 micron in this example which is sufficient for the purpose of the present embodiment. Further, use of an ultraviolet light which is usually used for the semiconductor exposure purpose is effective because usually a magneto-optic medium 6 shows a high absorption factor and the photon energy itself is high.

After the exposure of the mark 18a (18b) is completed, the shutter 13a (13b) is closed.

(b) FIG. 14B

Subsequently, at Step 506, the movable stage 5 is displaced through a vector "b" which is substantially the same as the vector extending from the position of the mark 18a (18b) exposure by the projection optical system 3 to the optical axis of the observation optical system 9, so as to locate the medium 6 at a position substantially right under the objective lens 16 of the observation optical system.

At that position, the magnetization images of the left-hand and right-hand marks, having been formed on the medium 6 as a result of step 506, are observed by use of the observation optical system 9. At this time, due to the difference in the state of polarization of light from the medium 6, which difference results from the difference in the magnetization, images of the marks are formed upon the TV camera 17. Therefore, the interval l between the left-hand and right-hand marks can be measured. For this measurement, the stage is displaced so as to locate one of the marks at a position substantially right under the optical axis of the observation optical system 9 and, thereafter, a positional error $\alpha_1$ is measured. Subsequently, the stage is displaced substantially through an amount $l_0$ so as to locate the other mark at a position substantially right under the optical axis of the observation optical system 9 and, thereafter, a positional error $\alpha_2$ is measured. The second-time displacement "$l_0$" of the stage is measured by means of the laser interferometric gauge 8. All the results of measurements are supplied to the computer 90 by way of respective signal lines, not shown. The interval l between the two marks at that time can be expressed by:

$$l = |l_0 + \alpha_1 - \alpha_2|$$

On the other hand, the magnification $\beta$ of the projection optical system 3 can be given by:

$$\beta = 1/L$$

Where such a magnification that can be treated as a reference is denoted by $\beta_0$, then the magnification error $\Delta\beta$ is expressed as follows:

$$\Delta\beta = \beta - \beta_0$$

These calculations are made by the computer 90 and, in the present embodiment, the magnification error $\Delta\beta$ is corrected by upwardly or downwardly displacing the reticle 2 by use of the reticle driving means 92 or, alternatively, by displacing one or ones of the lens elements of the projection optical system 3 by use of the lens driving means, not shown.

As for the focus control, the focus is detected by detecting the linewidth of the magnetization image of the mark, having been formed on the medium 6. The correspondence or interrelationship between the linewidth and the focus position may be based on a defocus versus linewidth curve which may be preparatorily stored in a processing unit (not shown) of the computer 90. Since the linewidth is variable with the amount of exposure, in the present embodiment the amount of exposure at the time of transfer of a mark 18a (18b) onto the medium, made at Step 505, is maintained constant. In order to correct the thus detected focus error, the wafer 4 is displaced upwardly or downwardly by the wafer stage driving means 93. Alternatively, one or more of the lens elements of the projection optical system 3 may be displaced for this purpose by use of the lens driving means, not shown. These operations are made at Steps 507-511.

(c) FIG. 14C

When, as the movable stage 5 is at an arbitrary position, the electromagnet 7 is actuated to apply an intense magnetic field downwardly to the medium 6, the whole of the medium 6 is magnetized downward so that the marks are erased. Thus, the medium 6 is prepared for reuse.

The present invention in this aspect is not limited to the form of the embodiment described just above, but may be modified conveniently in various ways. Examples are as follows:

(1.1) As for an erasably writable recording medium, a photochromic glass material which is sensitized by an light such as a ultraviolet light and is colored thereby, may be used. Further, any one of many varieties of recording media on which information (pattern) is erasably writable by use of light or radiation may be used. An example of such recording medium is an amorphous recording material in which a phase change between crystallization and uncrystallization occurs as a result of a temperature change.

Where such a recording medium described just above is used, there is no necessity of a magnetic field as required in the case of a magneto-optic recording medium used in the foregoing embodiment. Therefore, it is not necessary to use an electromagnet. Additionally, there is no necessity of providing a polarization microscope within the observation optical system.

Usually, a photochromic glass material has such characteristics that the speed of coloring in response to the irradiation of the same with light and the speed of decoloring after the irradiation is discontinued, are low. In consideration of this and by utilizing such a property of the photochromic glass material that the coloring and decoloring speed is increased with a lower temperature, a cooling mechanism may preferably be added to cool the photochromic glass material at the time of the mark printing and the mark erasing. If, nevertheless, the speed is not sufficiently high, a plurality of different positions may be defined on a photochromic glass plate, for the formation of images of the focus/magnification detecting marks, so that each time an image of a mark is formed at a different position. After a sufficient time period elapses and mark images formed at an initial stage are erased, mark images may be formed again at the initial mark image forming positions.

Further, depending on the material of photochromic glass used, there is a possibility that the photochromic glass material is sensitized not only by the photoprinting light but also by the observation light or any external light. In consideration of this, it may be desirable to add a heating mechanism for heating the photochromic glass material, contrary to the foregoing case, so as to retain, as much as possible, the state of the photochromic glass material for a time period after the mark exposure to the mark erasing (particularly, during the observation). Since a super-precision machine such as a stepper (step-and-repeat type exposure apparatus) is very sensitive to the temperature change, it is desirable, when such a cooling and/or heating mechanism is added, to use a suitable heat insulating means to isolate the cooling/heating mechanism so that the temperature change is not transmitted to surrounding components.

The modification described just above is attainable in the FIG. 12 embodiment by replacing the medium 6 by a photochromic glass plate; by replacing the electromagnet 7 by a heating/cooling device; and by forming the member 22 by a heat insulating material.

(1.2) Rather than providing an observation optical system at a position spaced from the optical axis of the projection optical system and in parallel to the optical axis of the projection optical system, as described in the foregoing, the optical arrangement may be modified so that a mark is observed from above the projection optical system and by way of the projection optical system. In such a case, the projection optical system and the observation optical system may have a common optical axis. Accordingly, there is an advantage that the necessity of moving the stage for displacing the medium from the position under the projection optical system to the position under the observation optical system can be omitted. However, usually a projection optical system is aberration-corrected only with respect to the photoprinting wavelength. Accordingly, there arise limitations such as, for example, that the observation should be made by use of the photoprinting wavelength or that chromatic aberration should be corrected.

(1.3) The observation optical system may also be used as an alignment optical system, only by a minute modification such as providing a reference mark within the observation optical system and measuring any error between the observed mark and the reference mark. In this case, where the observation optical system is provided at a position spaced from the optical axis of the projection optical system and is disposed in parallel to that optical axis, as in the FIG. 12 embodiment, the observation optical system can function as an "off-axis" alignment optical system. If, on the other hand, the observation optical system is disposed above the projection optical system as in the case described in paragraph (1.2), the observation optical system can function as a "TTL" (through-the-lens) alignment optical system.

In any case, a desired one of a die-by-die alignment procedure and a global alignment procedure can be selected and the exposures can be made accordingly. In the case of the die-by-die alignment procedure, the positional error of each shot area on a wafer is measured such that every shot area on the wafer is aligned on the basis of the positional error data peculiar thereto. In the case of the global alignment procedure, on the other hand, some shot areas (sample shot areas) on the wafer are elected and, from the measured values concerning the positions of alignment marks of these shot areas and from the coordinate positions of the wafer stage at the time of the measurements of the mark positions, a reference grid is prepared by calculation, the thus prepared reference grid being used subsequently to control the step-and-repeat movement of the stage to thereby control the alignment of all the shot areas of the wafer.

(1.4) The erasing of the mark at Step 512 may be conducted just before the mark exposure at Step 505. Further, at the time of erasing, the whole surface of the medium 6 may be irradiated with light. By doing so, the mark can be erased only with a magnetic field of an intensity similar to that of the magnetic field applied at the time of the mark exposure, without use of an intense magnetic field.

(1.5) The electromagnet 7 may be replaced by a permanent magnet which can be inverted upside-down. Also, with regard to the position thereof, it may be disposed at any of various positions other than the position right under the medium 6. In short, the magnetic field applying means may be of any structure and may be disposed at any position, provided that it can apply to the medium 6 and after the exposure, can apply a desired upward or downward magnetic field along the optical axis of the projection optical system 3.

(1.6) Depending on the material used for the magneto-optic recording medium 6, there is a limitation to the number of serviceable cycles. Also, there is a possibility of changes with aging. In consideration of them, the portion including the medium 6 may be preferably formed into a unit part, which can facilitate the replacement, for example.

(1.7) The irradiation of an alignment mark on a reticle may be made without use of the mark irradiating optical system 11a (11b). That is, the alignment mark may be irradiated by directly using the illumination optical system 1. In such a case, the whole surface of a reticle 2 may be illuminated. However, depending on the environmental conditions, it is possible that a formed mark image changes due to the heat. In order to prevent this, a masking mechanism may be provided within the illumination optical system 1 so as to assure that, with this masking mechanism, only a portion of the reticle 2 is illuminated to form an image of the mark.

(1.8) The mark irradiating optical system 11a (11b) may be used for the positioning of a reticle.

(1.9) On an occasion where the light source in the illumination optical system 1, used for the pattern printing, comprises an "ON/OFF" controllable light source means such as a laser, the shutter 13a (13b) may be omitted.

(1.10) As for the light source for irradiating the mark 18, it is not always necessary to extract a portion of the photoprinting light from the illumination optical system 1. A separate light source which produces a light of substantially the same wavelength may be used.

(1.11) Since the magnification of a projection optical system does not always change rectilinearly within the field of projection of the projection optical system, two or more pairs of magnification detecting marks may be provided so as to allow that the magnification is calculated by use of a least square method.

(1.12) Where a photochromic glass is used as the medium 6, the focus detection may be made on the basis of detection of the contrast of the mark image.

(1.13) The observation optical system 9 may be used to measure errors or deviations $\gamma_1$ and $\gamma_2$ in the direction perpendicular to a straight line connecting two images formed on the medium 6. By doing so, it becomes possible to detect the deviation of a reticle in the plane thereof (which is called "reticle rotation"), in terms of the following equation:

$$\theta = (\gamma_1 - \gamma_2)/l$$

For the correction of such an error, either a reticle or a wafer may be placed on a rotatable stage so that one of the reticle and wafer may be rotated in the plane thereof.

(1.14) At the time of measurement of the interval l between two marks for the detection of the magnification, the two marks may be observed simultaneously. This eliminates the necessity of the stage movement and, therefore, is effective to assure high-speed measurement.

Figure 16:
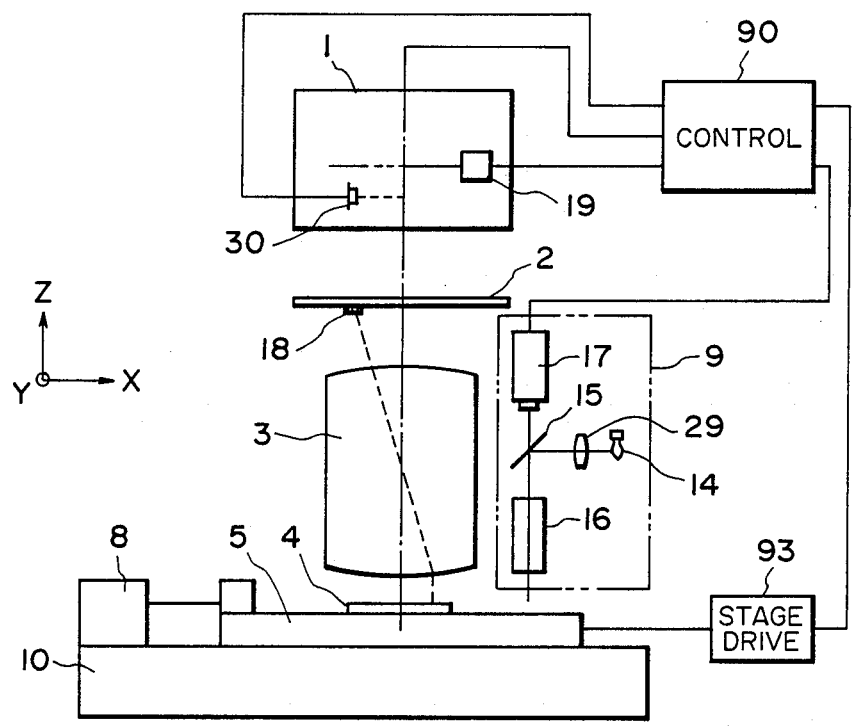
FIG. 16 is a schematic and diagrammatic view, showing a systematic structure of an exposure apparatus according to yet another embodiment of the present invention.

FIG. 16 is a schematic view showing a general structure of a step-and-repeat type projection exposure apparatus according to yet another embodiment of the present invention.

In FIG. 16, light emanating from an illumination optical system 1 irradiates a reticle 2 which is a first object so that a pattern formed thereon is transferred through a projection optical system 3 onto a wafer 4 which is a second object. The wafer 4 is coated with a resist material (photosensitive material) held on a movable stage 5 which is movably disposed on a surface plate 6.

The movable stage 5 is adapted to be moved in the X and Y directions as well as in a Z direction (along the optical axis of the projection optical system 3) by means of driving systems, not shown, and the displacement (the amount of movement) of the stage is monitored by use of the X-axis, Y-axis and Z-axis laser interferometric gauges. In FIG. 1, only the X-axis laser interferometric gauge is illustrated at reference numeral 8 and the Y-axis and Z-axis laser interferometric gauges are not shown. Each laser interferometric gauge 8 has an optical axis whose height is the same as the height of the wafer 4 surface for preclusion of an Abbe's error.

Denoted at 30 is an integration type exposure meter. Signals from the integration type exposure meter 30, representing exposures (exposure amounts) at successive time moments, are applied in sequence to a controller 90. If the attainment of a predetermined exposure amount is discriminated, a shutter of the illumination optical system 1 is closed in response to a signal from the controller 90, whereby the exposure is stopped.

If, at the time of transfer of a focus detecting pattern onto the resist layer, the amount of exposure (irradiating the pattern) changes, the state of the transferred pattern will change with the change in the exposure amount even when the pattern has been projected in an in-focus state. Accordingly, it becomes quite difficult to correctly discriminate the in-focus state or to correctly detect the amount of defocus. In the present embodiment, in consideration of this, it is important to accurately control the amount of exposure by use of the exposure meter 30.

Denoted at 19 is a masking mechanism provided within the illumination optical system 1. At the time of ordinary exposure (photoprinting of a circuit pattern), the masking mechanism is retracted. When a focus detecting pattern 18 formed on the reticle 2 surface is going to be projected upon a certain region on the wafer 5 so as to form an image of the pattern 18 on that region of the resist surface on the wafer 4, the masking mechanism is introduced to allow that only a portion of the reticle 2 surface close to the focus detecting pattern 18 is illuminated.

The masking member of the masking mechanism may be located, at this time, just above or below the reticle 2.

Observation system 9 is provided to observe an undeveloped image of the focus detecting pattern 18 (which image is a latent image of the pattern 18), having been formed on the resist layer on the wafer 4 surface.

As described with reference to the preceding embodiment, the inventors of the subject application have found the capability of focus control on the basis of detecting the line width, for example, of a magneto-optically formed image, formed on a magneto-optic recording medium with the aid of an imaging or projection optical system. Basically, the present embodiment has started with the preceding embodiment and, thus, is an advanced form of the preceding embodiment, particularly in the point that the necessity of use of a specific magneto-optic recording material in the preceding embodiment is omitted. Namely, in the present embodiment, the focus control is made on the basis of detecting the state of an image, being photochemically formed with the aid of the imaging or projection optical system upon an ordinary resist layer which is quite usually provided on a wafer. Thus, in the present embodiment, the focus is controlled by using a latent image of a reticle pattern, which latent image per se is known in the art as disclosed in Japanese Laid-Open Patent Application, Laid-Open No. Sho 61-114529.

Turning back to FIG. 16, the observation system 9 includes a light source 14 which produces light of a wavelength or wavelengths with respect to which the resist material of the wafer 4 is not sensitive. The light source 14 is imaged by means of a lens 29 at a position close to the pupil of an objective lens 16. The light emanating from the light source 14 goes by way of the lens 29, a half mirror 15 and the objective lens 16 to irradiate the wafer 4 surface. The light reflected from such region of the wafer 4 surface as being illuminated is received by the objective lens 16 and the received light is directed by way of the half mirror 15 to a TV camera 17, whereby the wafer 4 surface is observed. The operation of the present embodiment will be described in greater detail with reference to the flow chart of FIG. 17.

In order that the focus detecting pattern 18 formed on the reticle 2 is projected upon the wafer 4 surface to form thereon an image of that pattern, first at Step 601 the stage 5 is displaced by a stage driving means 93 so as to locate the pattern image forming position on the wafer 4 surface, at the location right under the projection optical system 3.

Then, at Step 602, the controller 90 controls the masking mechanism 19 so as t introduce the masking member of the mechanism into the path for the illumination light, such that the focus detecting pattern 18 is selectively irradiated with light from the illumination optical system 1 (Step 603). As a result, an image of the focus detecting pattern 18 is formed on the resist layer on the wafer 4 surface with the aid of the projection optical system 3. Subsequently, the wafer stage 5 is displaced again by the stage driving means 93 so as to locate the pattern image (which is an undeveloped image) at the position right under the observation system 9. The state of image-formation of the undeveloped pattern image at that time is observed by use of the TV camera 17 (Step 605).

The undeveloped pattern image picked-up by the TV camera 17 is processed by a computer (not shown) of the controller 90 (Step 606), and the amount of deviation δ of the focus with respect to a correct focus position is detected (Step 607), on the basis of, for example, the contrast of the pattern image or the size of the pattern image in comparison to the size of the original pattern. Within the computer of the controller 90, predetermined conversion equations concerning the interrelationship between the focus error δ and the contrast or size of the pattern image have been preparatorily stored. Thus, from the contrast, for example, as can be calculated from the pictorial image related to the undeveloped pattern image, the amount of deviation δ of the focus position can be determined.

Subsequently, at Step 608, as an example the wafer 4 is displaced vertically along the Z-axis and in the direction effective to correct the focus error δ so that the wafer 4 surface coincides with the focus position. Thereafter, at Step 609, the masking member is retracted and the projection exposure of the circuit pattern formed on the reticle 2 surface is initiated.

It is an alternative form of the present embodiment that the wafer stage driving means 93 is modified to move the wafer 4 stepwise along a vertical direction at predetermined regular increments (pitches) and, simultaneously therewith, to move the stage 5 horizontally and that, while moving the wafer 4 and stage 5 in the described manner, images of the focus detecting pattern 18 are formed at different positions on the wafer 4 surface. If this is adopted, the highest contrast position at which the pattern image has the maximum contrast, namely the best focus position, can be determined on the basis of the interpolation with respect to the contrast values of the pattern images corresponding to the different positions of the wafer 4 surface in the vertical direction, this being attainable without storing in the computer the conversion equations concerning the relation "contrast of the pattern image versus focus error".

Particularly, when a pulsed laser such as an excimer laser in which the pulse emission time (duration) is very short, is used as a light source, it is possible to form images of the focus detecting pattern 18 upon the wafer with continuous movement of the stage 5, namely without repeatedly stopping the stage 5 at the respective positions for the formation of those images of the focus detecting pattern. Thus, the throughput can be improved significantly.

In the present embodiment, an undeveloped image of the focus detecting pattern 18 may be utilized, for example, for the alignment of the reticle 2 and the wafer 4 or the detection of the magnification of the projection optical system 3. This may be made by use of the observation optical system 9 simultaneously with the focus detection.

The adjustment of the focus position is not limited to the vertical displacement of the wafer 4. For example, the focus adjustment is attainable by vertically displacing the wafer 2; by displacing the projection optical system 3 and some of the components thereof; or by changing the environmental conditions of the projection optical system 3.

Further, a variable-wavelength laser such as a band narrowed excimer laser may be used as a light source, such that the focus position can be adjusted by changing the wavelength by adjusting, for example, the angle of a mirror or etalon which is included as a part of a band-narrowing device.

The above-described embodiment uses a latent image forming process, according to which an image of a focus detecting pattern 18 is formed on a resist layer on a wafer 4 surface.

An embodiment of the present invention which will be described below uses a method which is contrasted to the latent image forming process. More specifically, in place of forming a latent image on a resist material, an optical writable/erasable recording medium such as, for example, a magneto-optic recording medium or a photochromic material is used.

Figure 18:
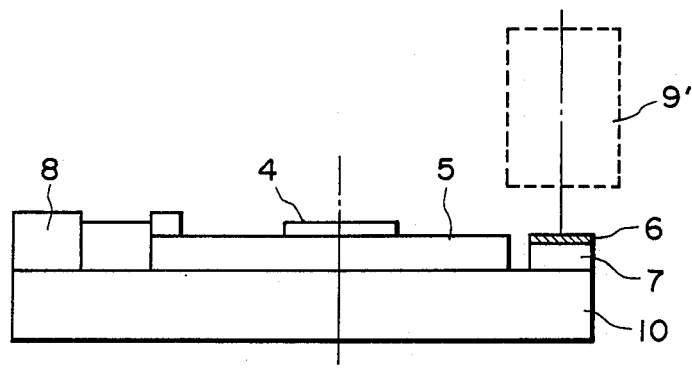
FIG. 18 is a schematic view showing a major portion, of an exposure apparatus according to still another embodiment of the present invention.

FIG. 18 is a fragmentary structural view showing a still further embodiment of the present invention, and shows an observation system 9' as well as the portion of the FIG. 16 apparatus which includes a wafer stage 5.

Denoted in FIG. 18 at 6 is a magneto-optic recording medium and, at 7 is a magnetic field producing means, comprising an electromagnet, for example, for applying to the recording surface of the medium 6 a perpendicular biasing magnetic field. As compared with the observation system 9 of the FIG. 16 embodiment, the observation system 9' of the present embodiment is provided by a polarization microscope. In FIG. 18, same reference numerals as of the FIG. 16 embodiment are assigned to corresponding elements, and description thereof is omitted here for simplicity.

Also in the present embodiment shown in FIG. 18, the wafer stage 5 is adapted to be moved precisely in each of the X, Y and Z directions by a stage driving means in accordance with a control signal from a controller. Further, the wafer stage 5 is arranged to be rotationally moved about the Z-axis.

In the present embodiment, an image of a focus detecting pattern is formed on the magneto-optic recording medium 6. In this case, the magneto-optic recording medium 6 is disposed so that the recording surface of the medium 6 has substantially the same height as the surface of the resist layer on the wafer 4.

In the portion of the magneto-optic recording medium 6 in which the image of the focus detecting pattern is formed, the direction of perpendicular magnetization is reversed due to the photothermoeffect. This means that a pattern corresponding to the state of focus of the formed image is recorded on the magneto-optic recording medium 6.

On the other hand, the magneto-optic recording medium 6 on which such a pattern has been recorded is thereafter subjected to the observation by the observation optical system 9' which comprises a polarization microscope, whereby the state of the recorded pattern is observed. More specifically, there is a difference between (i) the direction of polarization of a linearly polarized light reflected, as a result of the illumination of the medium 6, back from such portion of the medium which corresponds to the pattern and in which the magnetization has been reversed and (ii) the direction of polarization of a linearly polarized light reflected from the portion of the medium in which the magnetization has not been reversed. Accordingly, by observing the recording medium by selectively extracting the reflected light from the pattern by use of an analyzer or otherwise, the state of the pattern recorded on the recording medium, namely the degree of blur of the pattern and/or the size thereof, can be detected.

Since the sequential operation for the above-described observation is similar to that described with reference to the FIG. 16 embodiment, the explanation thereof is omitted here for simplicity.

After the focus detection is completed, a magnetic field of a predetermined intensity is applied by a magnetic field producing means 7 to the magneto-optic recording medium in a direction perpendicular to the recording surface of the recording medium. By this, the state of magnetization of such portion in which the reverse of magnetization has been caused can be returned to its initial state, such that the magneto-optic recording medium is prepared for reuse.

Use of an erasably writable optical recording medium in the manner described above provides a specific advantage that the focus can be detected repeatedly by use of one and the same recording medium, this being a significant contradistinction to the latent image forming method wherein an undesirable latent image is formed on a resist layer.

As for such an erasably writable optical recording medium usable in the present invention, there are many varieties of optical recording mediums, other than a magneto-optic recording medium. For example, a photochromic material described hereinbefore, an amorphous material wherein the phase is changeable between crystallization and uncrystallization, etc. are usable.

Where a photochromic material is used as a recording medium, the element denoted at 6 in FIG. 18 will be made of a photochromic material and, in such case, the element denoted at 7 may preferably be provided by a cooling means. Since usually a photochromic material has such characteristics that the speed of coloring and decoloring increases with lower temperature, it is easily possible to controllably increase or decrease, as desired, the image forming speed for the formation of an image of a focus detecting pattern and/or the image erasing speed for erasing the image of the focus detecting pattern after use, this being attainable by the action of the cooling means 7.

Figure 19A:
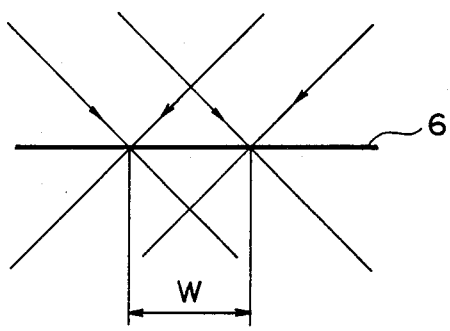
FIGS. 19A and 19B are schematic views, respectively, explicating the manner of focus detection in one aspect of the present invention.
Figure 19B:
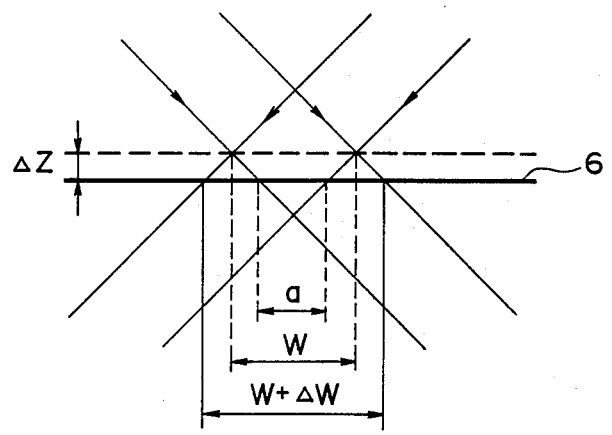

Finally, a convenient method of detecting the focus error on the basis of a pattern formed on a recording medium will be briefly described, taken in conjunction with FIGS. 19A and 19B. FIG. 19A shows the state of concentration of a pattern printing light in a case when the surface of the medium 6 is at an in-focus position of the projection optical system 3. FIG. 19B shows the state of concentration of the pattern printing light in a case when the surface of the medium 6 is deviated from the in-focus position by an amount $\Delta Z$.

Assuming that the linewidth of a pattern 18 (see FIG. 16 for example) formed on a reticle 2 is NW and the reducing magnification of the projection optical system 3 is 1/N, then in the FIG. 19A case the pattern printing light is concentrated upon the region of the medium 6 surface having a width W. In the FIG. 9B case, on the other hand, the light is concentrated upon a region of a width of "W+W". Where the F-number of the light is denoted by Fe, then there is a relation between $\Delta W$ and $\Delta Z$, such as follows:

$$\Delta Z = \Delta W \cdot Fe$$

It will be readily understood from the above that the focus error can be easily detected by detecting the width "W+W" by use of the observation optical system 9 (FIG. 16).

Usually, in a projection exposure apparatus to which the present invention is applicable, an allowable focus error is of an order of 0.5–1 micron and the F-number Fe is not greater than 1.4. Accordingly, the required detection accuracy with regard to the magnitude $\Delta W$ is, at the minimum, of an order of 0.35 micron. This numerical value, when it is magnified by use of an observation system having a magnification 40× to a magnitude "14 microns" upon the image pickup surface of a TV camera 17, approximately corresponds to the size of one pixel (picture element) of an ordinary charge coupled device. Thus, it is easily detectable in terms of an image. In other words, the focus error can be very easily detected by using an observation optical system 9 which is capable of magnifying an image, formed on a recording medium 6, at a magnification of about 40×.

It is seen from FIG. 19B that the portion of the medium 6 surface denoted at a can be exposed by substantially the same amount of exposure as of the portion of the medium 6 surface of the width W in the FIG. 19A example: whereas, in such portion of the region of the width "W+$\Delta$W" of the FIG. 19B example other than the portion a, the exposure amount is reduced remarkably. In consideration of this, it is necessary to control the exposure time so that, when the recording medium 6 comprises a magneto-optic recording material, a large amount of exposure sufficient for the reversal of the magnetic field is established at locations outside the portion a. Where the recording medium 6 comprises a photochromic material, it is necessary to control the exposure time so that a saturated exposure amount (i.e. a further increase in the density is not attainable with a larger exposure amount) is established at locations outside the portion a.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
    a projection optical system operable to project, by use of a light of a wavelength, a pattern formed on a first object upon a second object;
    a movable stage for holding thereon the second object;
    illumination means for irradiating a mark formed on the first object with a light having substantially the same wavelength as the light used for the projection of the pattern upon the second object;
    recording means including an erasably writable recording medium provided on said movable stage at a position different from the position at which the second object is held by said movable stage;
    detecting means operable to detect, without intervention of said projection optical system, an image recorded on said recording medium; and
    control means operable to control said illumination means so that an image of the mark on the first object is recorded on said recording medium with the intervention of said projection optical system.

2. An apparatus according to claim 1, wherein said recording medium of said recording means comprises a magneto-optic recording member.

3. An apparatus according to claim 1, wherein said recording medium of said recording means comprises a photochromic material.

4. An apparatus according to claim 1, wherein said recording medium is detachably mounted to said movable stage.

5. An apparatus according to claim 1, wherein said detecting means comprises a polarization microscope.

6. An apparatus according to claim 2, wherein said recording means includes a mechanism effective to apply, to said magneto-optic recording medium provided on said movable stage, a magnetic field in a direction parallel to an optical axis of said projection optical system.

7. An apparatus according to claim 6, wherein said control means is effective to establish a sequence according to which (i) the mark on the first object is exposed to light from said illumination means with the magnetic field being applied to said magneto-optic recording medium by said magnetic field applying mechanism, to form an image of the mark on said magneto-optic recording medium; (ii) thereafter said movable stage is moved to displace said magneto-optic recording medium toward said detecting means through a predetermined amount so that any deviation of the position of the formed image with respect to a reference position is measured by said detecting means; and (iii) subsequently an inverse magnetic field is applied to said magneto-optic recording medium to erase the image.

8. An apparatus according to claim 7, wherein the surface of said magneto-optic recording medium to be exposed to light has the same height as f the surface of the second object to be exposed to light.

9. An apparatus according to claim 3, wherein said recording means includes a cooling mechanism for cooling said photochromic material.

10. An apparatus according to claim 9, wherein said recording medium further includes a heating mechanism for heating said photochromic material.

11. An apparatus according to claim 1, wherein said recording medium of said recording means comprises a glass plate made of a photochromic material.

12. An apparatus according to claim 11, wherein said recording means includes a heating and cooling device for at least one of heating and cooling said photochromic glass plate.

13. An apparatus according to claim 12, wherein said heating and cooling device includes heat insulating means effective to prevent any temperature change in a portion of said apparatus close to said photochromic glass plate.

14. An apparatus according to claim 6, wherein said magnetic field applying mechanism includes a magnetic shield for preventing a magnetic field from being applied to a portion close to said magneto-optic recording medium.

15. An apparatus according to claim 1, wherein said recording medium comprises a glass plate made of a photochromic material and wherein said control means is operable to form, on said photochromic glass plate, plural images of the mark on the first object.

16. An apparatus according to claim 1, wherein said control means is operable also to control, on the basis of the detection by said detecting means, the position of the second object in a plane perpendicular to an optical axis of said projection optical system.

17. An apparatus according to claim 1, wherein said control means is also operable to detect, on the basis of the information concerning the image on said recording medium and detected by said detecting means, any deviation of the first object with respect to a direction contained in a plane perpendicular to an optical axis of said projection optical system.

18. An apparatus according to claim 1, wherein said control means is also operable to detect the projection magnification of said projection optical system, on the basis of the information concerning the image on said recording medium and detected by said detecting means.

19. An apparatus according to claim 1, wherein said control means is also operable to detect, on the basis of the information concerning the image on said recording medium and detected by said detecting means, the state of focus established between the first and second objects by said projection optical system.

20. An apparatus according to claim 1, wherein said control means is operable also to detect any error in at least one of the magnification and the focus position of said projection optical system, on the basis of the information concerning the image on said recording medium and detected by said detecting means, and wherein said control means is effective to establish a sequence according to which, after the detected error is corrected, said movable stage is moved to locate the second object at a position under an optical axis of said projection optical system and, subsequently, the pattern of the first object is transferred, by exposure, onto the surface of the second object.

21. An exposure method, comprising the steps of:
holding a first object having a mark formed thereon;
holding a second object on a movable stage;
illuminating the first object by use of an illumination optical system to print, by use of a projection optical system, an image of the mark of the first object upon a photosensitive layer provided on the second object or an erasably writable recording medium provided on the movable stage at a position different from the position at which the second object is held;
detecting the image of the mark by use of a detection optical system but without the intervention of the projection optical system; and
detecting the state of focus established between the first and second objects by the projection optical system, on the basis of the information corresponding to the image of the mark and detected by the detection optical system.

22. A method according to claim 21, wherein images of the mark of the first object are formed at different positions on the photosensitive layer or the recording medium provided on the second object, while changing the state of focus between the first and second objects.

23. A method according to claim 21, wherein a pulsed laser is used as a light source of the illumination optical system and wherein projection exposures are successively made while successively moving the second object in a direction of an optical axis of the projection optical system and in a direction perpendicular to the optical axis, so that images of the mark of the first object are printed at different positions on the photosensitive layer or the recording medium provided on the second object, with each image printed by one pulse from the pulsed laser.

24. A method according to claim 21, wherein a variable wavelength laser is used as a light source of the illumination optical system and wherein the state of focus between the first and second objects is adjusted on the basis of the detection of the state of focus and by changing the wavelength emanating from the variable wavelength laser.

* * * * *

UNITED STATES PATENT AND TRADEMARK OFFICE
CERTIFICATE OF CORRECTION

PATENT NO. : 4,875,076
DATED : October 17, 1989
INVENTOR(S) : Makoto Torigoe, et al.

It is certified that error appears in the above-identified patent and that said Letters Patent is hereby corrected as shown below:

ON THE TITLE PAGE, IN ITEM [57] ABSTRACT

Line 15, "example" should read --example,--.

IN THE DRAWINGS

Figure 17:
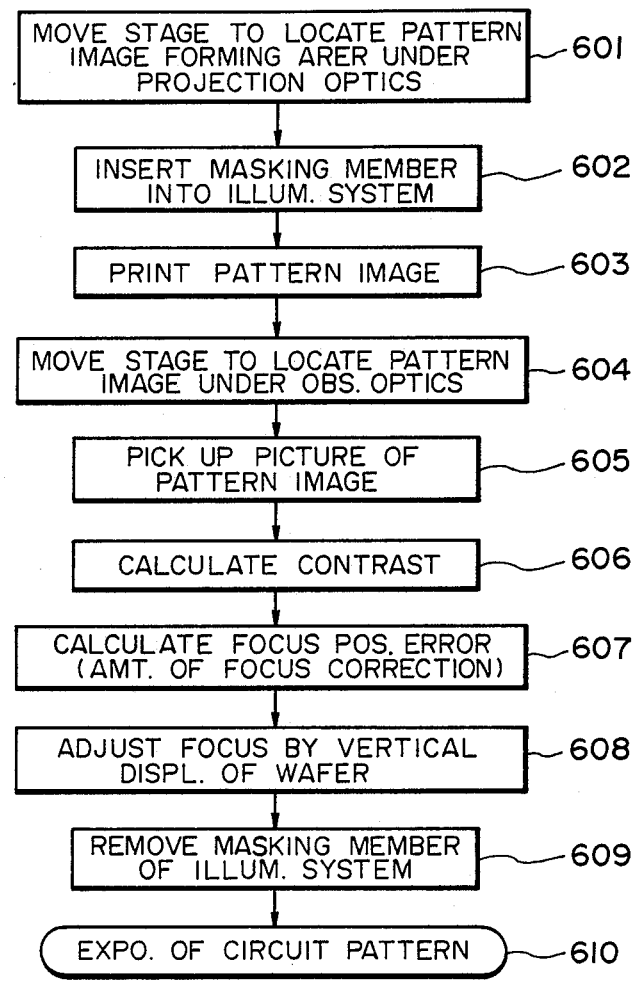
FIG. 17 is a flow chart showing the manner of the focusing operation made in the apparatus of FIG. 16.

Figure 17, "ARER" in logic block 601 should read --AREA--.

COLUMN 1

Line 36, delete "the".

COLUMN 3

Line 38, "it" should read --in--.
Line 52, "portion," should read --portion--.

COLUMN 4

Line 49, "Taking" should read --Taken--.

COLUMN 6

Line 6, "In this example" should read --In this example,--.
Line 42, "mark can be," should read --mark can be--.

UNITED STATES PATENT AND TRADEMARK OFFICE
CERTIFICATE OF CORRECTION

PATENT NO. : 4,875,076

DATED : October 17, 1989

INVENTOR(S) : Makoto Torigoe, et al.

It is certified that error appears in the above-identified patent and that said Letters Patent is hereby corrected as shown below:

COLUMN 7

Line 42, "step- and-repeat" should read
--step-and-repeat--.
  Line 56, "photochromic glass plate" should read
--a photochromic glass plate--.

COLUMN 8

Line 14, "Taking" should read --Taken--.
  Line 40, "Purpose" should read --purpose--.
  Line 42, "light, a" should read --light, and a--.
  Line 47, "movable stage" should read --movable stage 5--.
  Line 53, "abjective" should read --objective--.
  Line 67, "detected error "$\delta$"" should read
--detected $\alpha$--.

COLUMN 11

Line 49, "the" (first occurrence) should be deleted and
       after "from" insert --the--

COLUMN 12

Line 7, "of corresponding" should read --of a corresponding--.
  Line 25, "magnetic: shield" should read --magnetic shield--.

UNITED STATES PATENT AND TRADEMARK OFFICE
CERTIFICATE OF CORRECTION

PATENT NO. : 4,875,076

DATED : October 17, 1989

INVENTOR(S) : Makoto Torigoe, et al.

It is certified that error appears in the above-identified patent and that said Letters Patent is hereby corrected as shown below:

COLUMN 14

Line 4, "an" should read --a--.
Line 5, "a" should read "an--.

COLUMN 18

Line 23, "t introduce" should read --to introduce--.

COLUMN 19

Line 59, "same" should read --like--.
Line 60, delete "of".

COLUMN 21

Line 21, "FIG. 9B" should read --FIG. 19B--.
Line 23, " "W+ W". " should read --"W+$\Delta$W".--.
Line 29, " "W+W" " should read --"W+$\Delta$W"--.

UNITED STATES PATENT AND TRADEMARK OFFICE
CERTIFICATE OF CORRECTION

PATENT NO. : 4,875,076

DATED : October 17, 1989

INVENTOR(S) : Makoto Torigoe, et al.

It is certified that error appears in the above-identified patent and that said Letters Patent is hereby corrected as shown below:

COLUMN 22

Line 61, delete "f".

Signed and Sealed this

Nineteenth Day of March, 1991

Attest:

HARRY F. MANBECK, JR.

Attesting Officer

Commissioner of Patents and Trademarks